US011976001B2

(12) United States Patent
Kamimura et al.

(10) Patent No.: US 11,976,001 B2
(45) Date of Patent: May 7, 2024

(54) CHEMICAL LIQUID STORAGE BODY

(71) Applicant: FUJIFILM Corporation, Tokyo (JP)

(72) Inventors: Tetsuya Kamimura, Haibara-gun (JP); Masahiro Yoshidome, Haibara-gun (JP); Yukihisa Kawada, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1123 days.

(21) Appl. No.: 16/787,197

(22) Filed: Feb. 11, 2020

(65) Prior Publication Data
US 2020/0181008 A1 Jun. 11, 2020

Related U.S. Application Data

(63) Continuation of application No. PCT/JP2018/032173, filed on Aug. 30, 2018.

(30) Foreign Application Priority Data

Sep. 6, 2017 (JP) ................................. 2017-170832
Aug. 22, 2018 (JP) ................................. 2018-155196

(51) Int. Cl.
| B65D 23/02 | (2006.01) |
| C03C 17/00 | (2006.01) |
| C03C 17/245 | (2006.01) |
| C09G 1/00 | (2006.01) |
| G03F 7/004 | (2006.01) |
| H01L 21/027 | (2006.01) |

(52) U.S. Cl.
CPC ............ *C03C 17/245* (2013.01); *B65D 23/02* (2013.01); *C03C 17/004* (2013.01); *C09G 1/00* (2013.01); *G03F 7/0048* (2013.01); *C03C 2218/152* (2013.01); *H01L 21/0274* (2013.01)

(58) Field of Classification Search
CPC ......... B65D 23/02; C03C 17/004; C03C 4/20; C03F 7/0048; C09G 1/00; G03F 7/0048
USPC ....................................................... 206/205
See application file for complete search history.

(56) References Cited

U.S. PATENT DOCUMENTS

| 5,435,460 | A | * | 7/1995 | Osgar | ..................... | B65D 85/84 |
| | | | | | | 222/105 |
| 5,712,009 | A | * | 1/1998 | Moore | ..................... | B32B 27/32 |
| | | | | | | 206/524.1 |
| 5,759,653 | A | * | 6/1998 | Collette | ................. | B32B 27/36 |
| | | | | | | 428/35.8 |
| 6,237,809 | B1 | * | 5/2001 | Kawai | ................... | B67D 7/0261 |
| | | | | | | 222/105 |
| 6,582,787 | B1 | * | 6/2003 | Kawai | ................... | B32B 27/08 |
| | | | | | | 428/476.3 |
| 6,817,485 | B2 | * | 11/2004 | Kawai | ................... | B65D 1/0215 |
| | | | | | | 222/400.7 |
| 9,062,828 | B2 | * | 6/2015 | Tom | ......................... | F17C 13/02 |
| 10,099,912 | B2 | * | 10/2018 | You | ............................ | F17D 1/08 |
| 10,556,723 | B2 | * | 2/2020 | Lee | ........................ | B65D 23/104 |
| 2003/0189061 | A1 | * | 10/2003 | Kawai | .................. | B65D 1/0215 |
| | | | | | | 222/400.7 |
| 2007/0053046 | A1 | | 3/2007 | Tench et al. | | |
| 2008/0227015 | A1 | | 9/2008 | Nagatomo et al. | | |
| 2009/0038835 | A1 | | 2/2009 | Tanaka et al. | | |
| 2009/0283404 | A1 | | 11/2009 | Kakiuchi et al. | | |
| 2010/0239874 | A1 | | 9/2010 | Nakajima et al. | | |
| 2011/0015609 | A1 | | 1/2011 | Matsumoto | | |
| 2011/0111048 | A1 | | 5/2011 | Satoh et al. | | |
| 2011/0159219 | A1 | | 6/2011 | Yue et al. | | |

(Continued)

FOREIGN PATENT DOCUMENTS

| CN | 101523201 A | 9/2009 |
| CN | 101796217 A | 8/2010 |
| CN | 101980736 A | 2/2011 |

(Continued)

OTHER PUBLICATIONS

Communication dated Oct. 21, 2021, issued by the State Intellectual Property Office of the P.R.C. in application No. 201880056623.7.
Communication dated Apr. 20, 2021, from the Japanese Patent Office in application No. 2019-540924.
Office Action dated Aug. 4, 2022 in Taiwanese Application No. 107131033.
Communication dated Jan. 26, 2021 issued by the Korean Patent Office in counterpart Korean Application No. 10-2020-7003715.
International Search Report dated Dec. 4, 2018 from the International Searching Authority in International Application No. PCT/JP2018/032173.

(Continued)

*Primary Examiner* — Ernesto A Grano
(74) *Attorney, Agent, or Firm* — Sughrue Mion, PLLC

(57) ABSTRACT

An object of the present invention is to provide a chemical liquid storage body which hardly causes short and defects in a formed wiring board in a case where a chemical liquid stored in the chemical liquid storage body is used in a wiring forming process including photolithography after the chemical liquid storage body is preserved for a certain period of time. The chemical liquid storage body according to an embodiment of the present invention includes a container and a chemical liquid stored in the container, in which the chemical liquid contains at least one kind of specific metal component selected from the group consisting of Fe, Al, Cr, and Ni, a content of the specific metal component in the chemical liquid with respect to a total mass of the chemical liquid is equal to or smaller than 100 mass ppt, at least a portion of a liquid contact portion of the container is formed of glass containing sodium atoms, and provided that B represents a content of sodium atoms in a bulk region with respect to a total mass of the bulk region, and A represents a content of sodium atoms in a surface region with respect to a total mass of the surface region, a content mass ratio of A to B represented by A/B is higher than 0.10 and less than 1.0 in at least a portion of the liquid contact portion.

19 Claims, No Drawings

(56) References Cited

U.S. PATENT DOCUMENTS

| | | |
|---|---|---|
| 2013/0183512 A1 | 7/2013 | Gy et al. |
| 2017/0090315 A1 | 3/2017 | Tsujihiro |

FOREIGN PATENT DOCUMENTS

| | | | |
|---|---|---|---|
| CN | 102143923 A | 8/2011 | |
| CN | 103387890 A | 11/2013 | |
| CN | 103592003 A | 2/2014 | |
| CN | 106842843 A | 6/2017 | |
| GB | 1400823 A | 7/1975 | |
| JP | 59-35043 A | 2/1984 | |
| JP | 11-29148 A | 2/1999 | |
| JP | 11-278875 A | 10/1999 | |
| JP | 2001-294447 A | 10/2001 | |
| JP | 2005-170736 A | 6/2005 | |
| JP | 2012-501940 A | 1/2012 | |
| JP | 2013-47111 A | 3/2013 | |
| JP | 2014-213879 A | 11/2014 | |
| SG | 174176 A1 | 10/2011 | |
| WO | 2010/103894 A1 | 9/2010 | |
| WO | 2014/078164 A1 | 5/2014 | |

OTHER PUBLICATIONS

International Preliminary Report on Patentability dated Mar. 10, 2020 from the International Bureau in International Application No. PCT/JP2018/032173.

Written Opinion dated Dec. 4, 2018 from the International Bureau in International Application No. PCT/JP2018/032173.

* cited by examiner

CHEMICAL LIQUID STORAGE BODY

CROSS-REFERENCE TO RELATED APPLICATIONS

This application is a Continuation of PCT International Application No. PCT/JP2018/032173 filed on Aug. 30, 2018, which claims priority under 35 U.S.C. § 119(a) to Japanese Patent Application No. 2017-170832 filed on Sep. 6, 2017 and Japanese Patent Application No. 2018-155196 filed on Aug. 22, 2018. Each of the above applications is hereby expressly incorporated by reference, in its entirety, into the present application.

BACKGROUND OF THE INVENTION

1. Field of the Invention

The present invention relates to a chemical liquid storage body.

2. Description of the Related Art

In a case where semiconductor devices are manufactured by a wiring forming process including photolithography, as a prewet solution, a resist solution, a developer, a rinsing solution, a peeling solution, a Chemical Mechanical Polishing (CMP) slurry, a washing solution used after CMP, and the like, a chemical liquid containing water and/or an organic solvent is used.

In order to further improve the yield of semiconductor devices, there is a demand for a chemical liquid with a small impurity content. In recent years, the manufacturing of semiconductor devices at a node equal to or smaller than 10 nm has been examined, and accordingly, the demand for such a chemical liquid has become stronger.

A chemical liquid is stored in a container after being manufactured, preserved for a certain period of time in the form of a chemical liquid storage body, then taken out, and used.

As the container storing the chemical liquid, "a container for a film forming material that is formed of glass, in which the inner wall of the container is treated with a sulfur oxide by heating" is described in JP-S59-035043A (JP-1984-035043A).

Furthermore, JP-H11-029148A (JP-1999-029148A) describes "a glass container for a novolac resin-based positive photoresist accommodating a novolac resin-based positive photoresist solution containing organic solvents, in which the inner wall of the container is treated with a fluorinated hydrocarbon gas and a sulfite gas by heating".

SUMMARY OF THE INVENTION

The inventors of the present invention prepared a high-purity chemical liquid with an impurity content that is reduced to the currently required level, and stored the chemical liquid in the containers described in JP-S59-035043A (JP-1984-035043A) and JP-H11-029148A (JP-1999-029148A), thereby preparing chemical liquid storage bodies. Thereafter, the chemical liquid storage bodies were preserved for a certain period of time, the chemical liquid was then taken out of the chemical liquid storage bodies, and the chemical liquid was used in a wiring forming process including photolithography. As a result, it was revealed that sometimes short or defects occur in the obtained wiring board.

An object of the present invention is to provide a chemical liquid storage body which hardly causes short and defects in a formed wiring board in a case where a chemical liquid stored in the chemical liquid storage body is used in a wiring forming process including photolithography after the chemical liquid storage body is preserved for a certain period of time.

In order to achieve the aforementioned objects, the inventors of the present invention carried out an intensive examination. As a result, the inventors have found that the objects can be achieved by the following constitution.

(1) A chemical liquid storage body including a container and a chemical liquid stored in the container, in which the chemical liquid contains at least one kind of metal component selected from the group consisting of Fe, Al, Cr, and Ni, in a case where the chemical liquid contains one kind of metal component selected from the group consisting of Fe, Al, Cr, and Ni, a content of the metal component with respect to a total mass of the chemical liquid is equal to or smaller than 100 mass ppt, in a case where the chemical liquid contains two or more kinds of metal components selected from the group consisting of Fe, Al, Cr, and Ni, a total content of the metal components with respect to the total mass of the chemical liquid is equal to or smaller than 100 mass ppt, at least a portion of a liquid contact portion of the container is formed of glass containing sodium atoms, and provided that a region between a surface of the liquid contact portion and a position 10 nm below the surface in a thickness direction of the container is a surface region, a region between the surface and a position 2.0 µm below the surface in the thickness direction of the container is bulk region, B represents a content of sodium atoms in the bulk region with respect to a total mass of the bulk region, and A represents a content of sodium atoms in the surface region with respect to a total mass of the surface region, in a case where the surface region and the bulk region are measured by X-ray photoelectron spectroscopy, a content mass ratio of A to B represented by A/B is higher than 0.10 and less than 1.0 in at least a portion of the liquid contact portion.

(2) The chemical liquid storage body described in (1), in which the metal component contains metal particles.

(3) The chemical liquid storage body described in (1) or (2), in which the content mass ratio A/B is higher than 0.10 and less than 0.80.

(4) The chemical liquid storage body described in any one of (1) to (3), in which the content B is 1.0% to 20% by mass.

(5) The chemical liquid storage body described in any one of (1) to (4), in which the content B is 1.0% to 10% by mass.

(6) The chemical liquid storage body described in any one of (1) to (5), in which provided that D represents a content of $SiO_2$ in the bulk region with respect to the total mass of the bulk region, and C represents a content of $SiO_2$ in the surface region with respect to the total mass of the surface region, in a case where the surface region and the bulk region are measured by X-ray photoelectron spectroscopy, a content mass ratio of C to D represented by C/D is higher than 1.00 and less than 1.45 in at least a portion of the surface.

(7) The chemical liquid storage body described in (6), in which the content mass ratio C/D is higher than 1.00 and less than 1.30.

(8) The chemical liquid storage body described in (6) or (7), in which the content D is 68.0% to 80.0% by mass.

(9) The chemical liquid storage body described in any one of (1) to (8), in which the glass further contains at least one of calcium atoms or potassium atoms.

(10) The chemical liquid storage body described in any one of (1) to (9), in which the glass further contains calcium atoms, and provided that F represents a content of calcium atoms in the bulk region with respect to the total mass of the bulk region, and E represents a content of calcium atoms in the surface region with respect to the total mass of the surface region, in a case where the surface region and the bulk region are measured by X-ray photoelectron spectroscopy, a content mass ratio of E to F represented by E/F is higher than 0.10 and less than 0.90 in at least a portion of the surface.

(11) The chemical liquid storage body described in (10), in which the content mass ratio E/F is higher than 0.10 and less than 0.70.

(12) The chemical liquid storage body described in (10) or (11), in which the content F is 0.10% to 15% by mass.

(13) The chemical liquid storage body described in any one of (10) to (12), in which the content F is 0.10% to 10% by mass.

(14) The chemical liquid storage body described in any one of (1) to (13), in which the glass further contains boron atoms, and provided that H represents a content of boron atoms in the bulk region with respect to the total mass of the bulk region, and G represents a content of boron atoms in the surface region with respect to the total mass of the surface region, in a case where the surface region and the bulk region are measured by X-ray photoelectron spectroscopy, a content mass ratio of G to H represented by G/H is higher than 0.10 and less than 0.90 in at least a portion of the surface.

(15) The chemical liquid storage body described in any one of (1) to (14), in which a void volume calculated by the following equation is 5% to 40% by volume, and in a void portion of the container, the number of particles having a particle diameter equal to or greater than 0.05 μm is 1 to 1,000/m$^3$.

Equation: void volume={1−(volume of chemical liquid in container/volume of container)}×100

(16) The chemical liquid storage body described in any one of (1) to (15), in which in the chemical liquid, the number of particles having a particle diameter equal to or greater than 0.05 μm is 5 to 500/ml.

(17) The chemical liquid storage body described in any one of (1) to (16), in which in a void portion of the container, a concentration of an organic phosphorus compound is 0.01 to 100 volume ppb.

According to the present invention, it is possible to provide a chemical liquid storage body which hardly causes short (hereinafter, described as "having short inhibition performance" as well) and hardly causes defects (hereinafter, described as "having defect inhibition performance" as well) in a formed wiring board in a case where a chemical liquid stored in the chemical liquid storage body is used in a wiring forming process including photolithography after the chemical liquid storage body is preserved for a certain period of time.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "ppm" means "parts-per-million $(10^{-6})$", "ppb" means "parts-per-billion $(10^{-9})$", "ppt" means "parts-per-trillion $(10^{-12})$", and "ppq" means "parts-per-quadrillion $(10^{-15})$".

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, far ultraviolet rays, extreme ultraviolet (EUV), X-rays, electron beams, and the like. In addition, in the present invention, light means actinic rays or radiation. In the present invention, unless otherwise specified, "exposure" includes not only exposure, far ultraviolet rays, X-rays, and EUV, and the like, but also lithography by particle beams such as Electron beams or ion beams.

[Chemical Liquid Storage Body]

The chemical liquid storage body according to an embodiment of the present invention has a container and a chemical liquid stored in the container, in which the chemical liquid contains at least one kind of metal component (hereinafter, referred to as "specific metal component" as well) selected from the group consisting of Fe, Al, Cr, and Ni, in a case where the chemical liquid contains one kind of specific metal component selected from the group consisting of Fe, Al, Cr, and Ni, a content of the specific metal component in the chemical liquid with respect to a total mass of the chemical liquid is equal to or smaller than 100 mass ppt, in a case where the chemical liquid contains two or more kinds of specific metal components selected from the group consisting of Fe, Al, Cr, and Ni, a total content of the specific metal components in the chemical liquid with respect to the total mass of the chemical liquid is equal to or smaller than 100 mass ppt, at least a portion of a liquid contact portion of the container is formed of glass containing sodium atoms, and provided that a region between a surface of the container and a position 10 nm below the surface in a thickness direction of the container is a surface region, a region between the surface and a position 2.0 μm below the surface in the thickness direction of the container is bulk region, B represents a content of sodium atoms in the bulk region with respect to a total mass of the bulk region, and A represents a content of sodium atoms in the surface region with respect to a total mass of the surface region, in a case where the surface region and the bulk region are measured by X-ray photoelectron spectroscopy, a content mass ratio of A to B represented by A/B is higher than 0.10 and less than 1.0 in at least a portion of the liquid contact portion.

The inventors of the present invention prepared a high-purity chemical liquid with an impurity content that is reduced to the currently required level (hereinafter, referred to as "high-purity chemical liquid" as well), and stored the chemical liquid in the containers described in JP-S59-035043A (JP-1984-035043A) and JP-H11-029148A (JP-1999-029148A), thereby preparing chemical liquid storage bodies. Thereafter, the chemical liquid storage bodies were preserved for a certain period of time, and then the chemical liquid was then taken out of the chemical liquid storage bodies and used in a wiring forming process including photolithography. As a result, it was revealed that sometimes short or defects occur in the obtained wiring board.

The inventors of the present invention have conducted an intensive examination regarding why the short inhibition performance and the defect inhibition performance deteriorate over time even though the high-purity chemical liquid is stored in the container described in JP-S59-035043A (JP-1984-035043A) and JP-H11-029148A (JP-1999-029148A) in which an impurity insolubilization treatment is performed on the liquid contact portion.

As a result, the inventors have found that because the content of impurities, which are contained in the high-purity chemical liquid from the initial stage of preparation, is significantly smaller than that in the conventional chemical liquids, in a case where the high-purity chemical liquid is stored in a container, the chemical liquid tends to more easily causes impurities to be eluted from the liquid contact portion of the container. The inventors of the present invention consider that the above characteristics of the high-purity chemical liquid may be related to the phenomenon in which the short inhibition performance and the defect inhibition performance deteriorate over time in the chemical liquid storage body.

Therefore, in order to select a container for storing the high-purity chemical liquid, the inventors of the present invention preserved the chemical liquid storage body prepared as above for a certain period of time, comprehensively analyzed the types of impurities contained in the chemical liquid taken out of the chemical liquid storage body after the preservation, and performed an examination to ascertain what kind of impurities are eluted into the chemical liquid over time and which impurities influence the short inhibition performance and the defect inhibition performance. As a result, the inventors assumed that sodium atoms eluted into the chemical liquid may exert a great influence. Sodium atoms are alkali metals and have the characteristics of being easily diffused in a wiring board. The inventors assumed that, accordingly, in a case where the chemical liquid contains sodium atoms, the sodium atoms may easily cause short in a wiring board.

Consequently, in order to make it more difficult for sodium atoms to be eluted into the preserved chemical liquid, the inventors of the present invention prepared a chemical liquid storage body by using a glass bottle in which A/B representing a content mass ratio of the content A of sodium atoms in the surface region with respect to the total mass of the surface region (A=content of sodium atoms in surface region/total mass of surface region) to the content B of sodium atoms in the bulk region with respect to the total mass of the bulk region of the container (B=content of sodium atoms in bulk region/total mass of bulk region of container) is smaller. Furthermore, the inventors investigated the short inhibition performance and the defect inhibition performance of the chemical liquid after the preservation. As a result, the inventors have found that although the chemical liquid after the preservation has excellent short inhibition performance, contrary to expectations, the defect inhibition performance thereof deteriorates in some cases.

The inventors of the present invention further repeated examinations regarding why the defect inhibition performance deteriorates even though the chemical liquid storage body is prepared by controlling A/B to become smaller so as to further reduce the content of sodium atoms eluted into the chemical liquid.

As a result, the inventors have found that in a case where the chemical liquid after the preservation contains a trace of sodium atoms, the content of other metal impurities (typically, Fe, Al, Cr, and Ni) in the chemical liquid tends to be reduced, and such a chemical liquid tends to have excellent defect inhibition performance.

The inventors of the present invention conducted an intensive examination regarding the phenomenon in which the elution of a trace of sodium atoms into the chemical liquid preserved in a container inhibits the elution of metal impurities described above. As a result, the inventors assumed that the phenomenon may be related to the ionization tendency of sodium atoms.

That is, the inventors assumed that because sodium atoms have a high ionization tendency, in a case where a chemical liquid storage body is prepared using a container from which a trace of sodium atoms having a high ionization tendency are likely to be eluted, the elution of metal impurities having a lower ionization tendency into the chemical liquid may be greatly suppressed during the preservation. The inventors assumed that because the content of impurities that the high-purity chemical liquid initially contains from the initial stage of preparation is significantly smaller than that in conventional chemical liquids as described above, in a case where such a chemical liquid is stored in a container, due to the characteristics of more easily causing impurities to be eluted from a liquid contact portion of the container, the special phenomenon described above may occur.

In this way, the inventors of the present invention have found that in a case where A/B in the liquid contact portion of the container is controlled within a predetermined range, a chemical liquid storage body having the effects of the present invention is obtained, and have accomplished the present invention. Hereinafter, the chemical liquid storage body according to the embodiment of the present invention will be specifically described.

In the present specification, the defect inhibition performance of a chemical liquid is evaluated by a method using a wafer surface inspection device (SP-5; manufactured by KLA-Tencor Corporation). Details of the procedure of the method are as described in Examples. Defects are detected using this device according to the following principle. First, a wafer is coated with a chemical liquid, and the surface of the wafer coated with the chemical liquid is irradiated with a laser beam. In a case where the laser beam hits foreign substances and/or defects, light is scattered, the scattered light is detected by a detector, and the foreign substances and the defects are detected. Furthermore, in a case where the measurement is performed in a state of rotating the wafer during the irradiation with the laser beam, from the rotation angle of the wafer and the radial position of the laser beam, the coordinate locations of the foreign substances and the defects can be assigned.

In addition to SP-5 described above, an inspection device adopting the same measurement principle as SP-5 can be used for evaluating the defect inhibition performance of a chemical liquid. Examples of the inspection device include a Surfscan series manufactured by KLA-Tencor Corporation, and the like. Particularly, for evaluating the defect inhibition performance of a chemical liquid used for manufacturing micro-semiconductor devices at a node equal to or smaller than 10 nm, it is preferable to use "SP-5" described above or a wafer surface inspection device (typically, devices sequel to SP-5, or the like) having resolution equal to or higher than the resolution of "SP-5".

<Container>

As a container relating to the chemical liquid storage body described above, known containers can be used without particular limitation as long as at least a portion of the liquid contact portion is formed of glass containing sodium atoms (hereinafter, referred to as "specific glass" as well). In the present specification, the liquid contact portion means a portion which is likely to contact a stored chemical liquid in a case where the chemical liquid is stored in the container.

At least a portion of the liquid contact portion of the container may be formed of the specific glass. In view of obtaining a chemical liquid storage body having further improved effects of the present invention, the specific glass preferably constitutes 70% or more of the area of the liquid contact portion, more preferably constitutes 90% or more of the area of the liquid contact portion, particularly preferably constitutes the entirety of the liquid contact portion, and most preferably constitute the entirety of the internal surface of the container.

There is no particular limitation on the aspect of the container in which at least a portion of the liquid contact portion is formed of the specific glass. Typical examples thereof include a case where the container is formed of the specific glass, and an aspect in which the container has a base material and a coating layer that is on the base material and formed of the specific glass.

[First Embodiment of Chemical Liquid Storage Body]

The chemical liquid storage body according to a first embodiment of the present invention is a container formed of the specific glass, in which A/B measured by a predetermined method is higher than 0.10 and less than 1.0 in at least a portion of a liquid contact portion of the container.

In the container according to the present embodiment, the relationship described above may be satisfied in at least a portion of the liquid contact portion. In view of obtaining a chemical liquid storage body having further improved effects of the present invention, the relationship described above is preferably satisfied in an area accounting for 70% or more of the liquid contact portion, more preferably satisfied in an area accounting for 90% or more of the liquid contact portion, and even more preferably satisfies in the entirety of the liquid contact portion.

The specific glass is glass containing sodium atoms. As the specific glass, known glass can be used without particular limitation. Examples thereof include soda lime glass, borosilicate glass, and the like. The content of sodium atoms contained in the specific glass (average content in the entire specific glass used in the container) is not particularly limited, but is preferably 0.01% to 25% by mass with respect to the total mass of the specific glass in general.

The shape of the container is not particularly limited, and can be arbitrarily selected from the shapes generally used for containers for storing a chemical liquid. The thickness of the container is not particularly limited, but is preferably 1.0 to 5.0 mm in general. Particularly, in a portion corresponding to the bottom of the container, the thickness of the container is more preferably equal to or greater than 2.5 mm.

In the container, the shape and the position of the liquid contact portion are not particularly limited. Generally, a portion or the entirety of the inner wall surface of the container corresponds to the liquid contact portion. Furthermore, the container may be container with a lid that has a lid.

(Sodium Atoms)

In the container, the distribution of the content of sodium atoms in the thickness of the container satisfies the following relationship in at least a portion of the liquid contact portion. That is, provided that a region between a surface of the container and a position 10 nm below the surface in a thickness direction of the container is surface region, a region between the surface of the container and a position 2.0 μm below the thickness direction of the container is a bulk region, B represents a content of sodium atoms in the bulk region with respect to the total mass of the bulk region, and A represents a content of sodium atoms in the surface region with respect to the total mass of the surface region, in a case where the surface region and the bulk region are measured by X-ray photoelectron spectroscopy (XPS), a content mass ratio of A to B represented by A/B is higher than 0.10 and less than 1.0.

The content A represents the content (% by mass) of sodium atoms determined on the assumption that the total mass of the surface region is 100% by mass, and the content B is the content (% by mass) of sodium atoms determined on the assumption that the total mass of the bulk region is 100% by mass.

The measurement conditions for XPS and the method for analyzing the content of sodium atoms in the thickness direction of the container are as described in Examples. Specifically, in the surface region, XPS is performed at six spots in the thickness direction of the container at equal intervals. In the bulk region, XPS is performed at four spots in the thickness direction of the container at equal intervals. By calculating the arithmetic mean of the obtained results, the total mass of each of the regions, the content A, and the content B are determined. More specifically, for the surface region, the surface is regarded as 0 nm, and at six spots 0 nm, 2 nm, 4 nm, 6 nm, 8 nm, and 10 nm below the surface, the total content of atoms and the content of sodium atoms are measured. The arithmetic mean of the obtained results is calculated, and the total mass of the surface region and the content A are calculated. For the bulk region, the surface is regarded as 0 nm, and at four spots 500 nm, 1,000 nm, 1,500 nm, and 2,000 nm (2.0 μm) below the surface, the total content of atoms and the content of sodium atoms are measured. The arithmetic mean of the obtained results is calculated, and the total mass of the bulk region and the content B are calculated.

Particularly, in view of obtaining a chemical liquid storage body having further improved effects of the present invention, the content mass ratio A/B is more preferably less than 0.90, even more preferably less than 0.80, particularly preferably equal to or lower than 0.50, and most preferably equal to or lower than 0.30. The above relationship may be satisfied in at least a portion of the liquid contact portion. However, in view of obtaining a chemical liquid storage body having further improved effects of the present invention, the above relationship is more preferably satisfied in an area accounting for 70% or more of the liquid contact portion, even more preferably satisfied in an area accounting for 90% or more of the liquid contact portion, and particularly preferably satisfied in the entirety of the liquid contact portion.

The content A of sodium atoms in the surface region is not particularly limited. However, in view of obtaining a chemical liquid storage body having further improved effects of the present invention, the content A is preferably 0.010% to 5.0% by mass, more preferably 0.050% to 3.5% by mass, even more preferably 0.10% to 2.5% by mass, particularly preferably 0.10 to 2.0% by mass, and most preferably 0.10% to 1.4% by mass.

The content B of sodium atoms in the bulk region is not particularly limited. However, in view of obtaining a chemical liquid storage body having further improved effects of the present invention, the content B is preferably 0.4% to 25% by mass, more preferably 0.6% to 20% by mass, even more preferably 1.0% to 17% by mass, particularly preferably 1.0% to 13% by mass, more particularly preferably 1.0% to 10% by mass, and most preferably 1.0% to 9.0% by mass.

In a case where the content B is equal to or greater than 0.6% by mass, the defect inhibition performance of the chemical liquid storage body is further improved. In contrast, in a case where the content B is equal to or smaller than 20% by mass, the short inhibition performance of the chemical liquid storage body is further improved. Particularly, in a case where the content B is equal to or smaller than 10% by mass, the short inhibition performance of the chemical liquid storage body is further improved.

($SiO_2$)

It is preferable that the specific glass further contains $SiO_2$. The content of $SiO_2$ contained in the specific glass is not particularly limited, but is preferably 60% to 99% by mass in general.

The distribution of $SiO_2$ in the container along the thickness direction thereof is not particularly limited. However, in view of obtaining a chemical liquid storage body having further improved effects of the present invention, it is preferable that the distribution of $SiO_2$ satisfies the following relationship in at least a portion of the liquid contact portion. That is, provided that C represents a content of $SiO_2$ in the surface region with respect to the total mass of the surface region, and D represents a content of $SiO_2$ in the bulk region with respect to the total mass of the bulk region, in a case where the surface region and the bulk region are measured by XPS, a content mass ratio of C to D represented by C/D is preferably higher than 1.00 and less than 1.45. Particularly, in view of obtaining a chemical liquid storage body having further improved effects of the present invention, the content mass ratio C/D is more preferably less than 1.40, and even more preferably less than 1.30.

In a case where the content mass ratio C/D is higher than 1.00, the short inhibition performance of the chemical liquid storage body is further improved. In contrast, in a case where the content mass ratio C/D is less than 1.45, the defect inhibition performance of the chemical liquid storage body is further improved.

The content of $SiO_2$ in the container is calculated from the content of Si atoms detected by XPS. That is, on the assumption that all the Si atoms detected by XPS are $SiO_2$, the content (% by mass) of $SiO_2$ is calculated from the obtained content (% by mass) of Si. Other measurement conditions are as described in Examples, and the method for calculating the content from the measured value is the same as the method for calculating the content of sodium atoms described above.

The relationship described above may be satisfied in at least a portion of the liquid contact portion. However, in view of obtaining a chemical liquid storage body having further improved effects of the present invention, the relationship is more preferably satisfied in an area accounting for 70% or more of the liquid contact portion, even more preferably satisfied in an area accounting for 90% or more of the liquid contact portion, and particularly preferably satisfied in the entirety of the liquid contact portion.

The content C of $SiO_2$ in the surface region is not particularly limited. However, in view of obtaining a chemical liquid storage body having further improved effects of the present invention, the content C is preferably 55.0% to 99.8% by mass, more preferably 77.0% to 99.7% by mass, even more preferably 85.0% to 99.6% by mass, and particularly preferably 90.0% to 99.6% by mass.

The content D of $SiO_2$ in the bulk region is not particularly limited. However, in view of obtaining a chemical liquid storage body having further improved effects of the present invention, the content D is preferably equal to or greater than 60.0% by mass, more preferably equal to or greater than 65.0% by mass, even more preferably equal to or greater than 68.0% by mass, particularly preferably equal to or greater than 75.0% by mass, and most preferably equal to or greater than 76.0% by mass. The content D is preferably equal to or smaller than 85.0% by mass, and more preferably equal to or smaller than 80.0% by mass.

In a case where the content D is equal to or greater than 68.0% by mass, the short inhibition performance of the chemical liquid storage body is further improved. In a case where the content D is equal to or smaller than 80.0% by mass, the defect inhibition performance of the chemical liquid storage body is further improved.

(Calcium Atoms)

It is preferable that the specific glass further contains calcium atoms. The content of calcium atoms contained in the specific glass is not particularly limited, but is preferably 0.010% to 20% by mass in general.

The distribution of calcium atoms in the container along the thickness direction thereof is not particularly limited. However, in view of obtaining a chemical liquid storage body having further improved effects of the present invention, it is preferable that the distribution of calcium atoms satisfies the following relationship in at least a portion of the liquid contact portion. That is, provided that E represents a content of calcium atoms in the surface region with respect to the total mass of the surface region, and F represents a content of calcium atoms in the bulk region with respect to the total mass of the bulk region, in a case where the surface region and the bulk region are measured by XPS, a content mass ratio of E to F represented by E/F is preferably higher than 0.10 and less than 0.90. Particularly, in view of obtaining a chemical liquid storage body having further improved effects of the present invention, the content mass ratio E/F is more preferably less than 0.70, even more preferably less than 0.65, and particularly preferably less than 0.55.

In a case where the content mass ratio E/F is higher than 0.10, the defect inhibition performance of the chemical liquid storage body is further improved. In a case where the content mass ratio E/F is less than 0.90, the short inhibition performance of the chemical liquid storage body is further improved.

It is unclear why the defect inhibition performance of the chemical liquid storage body is further improved in a case where the content mass ratio E/F is higher than 0.10. Presumably, this phenomenon may result from the same mechanism as that operating by A/B relating to sodium atoms described above. That is, presumably, in a case where the content mass ratio E/F is higher than 0.10, calcium atoms (typically, calcium ions) may be eluted into the chemical liquid over time, and consequently, the elution of the metal component (typically, the specific metal component) having low ionization tendency may be further inhibited during the preservation, and the defect inhibition performance of the chemical liquid after the preservation may be further improved.

Meanwhile, presumably, because of the same mechanism as that operating by A/B relating to sodium atoms described above, the short inhibition performance of the chemical liquid storage body may be further improved in a case where the content mass ratio E/F is less than 0.90. That is, presumably, in a case where the content mass ratio E/F is less than 0.90, calcium atoms are hardly eluted into the chemical liquid over time, and the short inhibition performance of the chemical liquid may be further improved.

The conditions for measuring the content of calcium atoms in the container are as described above in Examples, and the method for calculating the content from the measured values is the same as the method for calculating the content of sodium atoms described above.

The content E of calcium atoms in the surface region is not particularly limited. However, in view of obtaining a chemical liquid storage body having further improved effects of the present invention, the content E is preferably 0.0060% to 2.0% by mass, more preferably 0.010% to 1.90% by mass, even more preferably 0.016% to 1.80% by mass, and particularly preferably 0.16% to 1.1% by mass.

The content F of calcium atoms in the bulk region is not particularly limited. However, in view of obtaining a chemical liquid storage body having further improved effects of the present invention, the content F is preferably equal to or greater than 0.040% by mass, more preferably equal to or greater than 0.10% by mass. The content F is preferably equal to or smaller than 16% by mass, more preferably equal to or smaller than 15% by mass, even more preferably equal to or smaller than 14% by mass, particularly preferably equal to or smaller than 10% by mass, more particularly preferably equal to or smaller than 9.0% by mass, and most preferably equal to or smaller than 8.0% by mass.

In a case where the content F is equal to or greater than 0.10% by mass, the defect inhibition performance of the chemical liquid storage body is further improved. Furthermore, in a case where the content F is equal to or smaller than 15.0% by mass, the short inhibition performance of the chemical liquid storage body is further improved.

(Potassium Atoms)

It is preferable that the specific glass further contains potassium atoms. The content of potassium atoms contained in the specific glass is not particularly limited, but is preferably 0.010% to 20% by mass in general.

(Boron Atoms)

It is preferable that the specific glass further contains boron atoms. The content of boron atoms contained in the specific glass is not particularly limited, but is preferably 0.010% to 20% by mass in general.

The distribution of boron atoms in the container along the thickness direction thereof is not particularly limited. However, in view of obtaining a chemical liquid storage body having further improved effects of the present invention, it is preferable that the distribution of boron atoms satisfies the following relationship in at least a portion of the liquid contact portion. That is, provided that G represents a content of boron atoms in the surface region with respect to the total mass of the surface region, and H represents a content of boron atoms in the bulk region with respect to the total mass of the bulk region, in a case where the surface region and the bulk region are measured by XPS, a content mass ratio of G to H represented by G/H is preferably higher than 0.10 and less than 0.90. Particularly, in view of obtaining a chemical liquid storage body having further improved effects of the present invention, the content mass ratio G/H is more preferably less than 0.70, even more preferably less than 0.65, and particularly preferably less than 0.55.

In a case where the content mass ratio G/H is higher than 0.10, the defect inhibition performance of the chemical liquid storage body is further improved. In a case where the content mass ratio G/H is less than 0.90, the short inhibition performance of the chemical liquid storage body is further improved.

It is unclear why the defect inhibition performance of the chemical liquid storage body is further improved in a case where the content mass ratio G/H is higher than 0.10. Presumably, this phenomenon may result from the same mechanism as that operating by A/B relating to sodium atoms described above. That is, presumably, in a case where the content mass ratio G/H is higher than 0.10, boron atoms (typically, boron ions) may be eluted into the chemical liquid over time, and consequently, the elution of the metal component (typically, the specific metal component) having low ionization tendency may be further inhibited during the preservation, and the defect inhibition performance of the chemical liquid after the preservation may be further improved.

Meanwhile, presumably, because of the same mechanism as that operating by A/B relating to sodium atoms described above, the short inhibition performance of the chemical liquid storage body may be further improved in a case where the content mass ratio G/H is less than 0.90. That is, presumably, in a case where the content mass ratio G/H is less than 0.90, boron atoms are hardly eluted into the chemical liquid over time, and the short inhibition performance of the chemical liquid may be further improved.

The conditions for measuring the content of boron atoms in the container are as described above in Examples, and the method for calculating the content from the measured values is the same as the method for calculating the content of sodium atoms described above.

The content E of boron atoms in the surface region is not particularly limited. However, in view of obtaining a chemical liquid storage body having further improved effects of the present invention, the content E is preferably 0.0060% to 2.0% by mass, more preferably 0.010% to 1.90% by mass, even more preferably 0.016% to 1.80% by mass, and particularly preferably 0.16% to 1.1% by mass.

The content F of boron atoms in the bulk region is not particularly limited. However, in view of obtaining a chemical liquid storage body having further improved effects of the present invention, the content F is preferably equal to or greater than 0.040% by mass, and more preferably equal to or greater than 0.10% by mass. The content F is preferably equal to or smaller than 20% by mass, more preferably equal to or smaller than 15% by mass, even more preferably equal to or smaller than 14% by mass, particularly preferably equal to or smaller than 10% by mass, more particularly preferably equal to or smaller than 9.0% by mass, and most preferably equal to or smaller than 8.0% by mass.

As the method for adjusting the content of sodium atoms, $SiO_2$, calcium atoms, potassium atoms, and boron atoms in the container and the method for adjusting the distribution of the content in the thickness direction, known methods can be used without particular limitation. Examples of the known methods include the methods described in JP-S59-035043A (JP-1984-035043A), JP2003-128439A, JP-H07-041335A (JP-1995-041335A), and the like.

Furthermore, it is also possible to use a method of washing the liquid contact portion of the container by using a washing solution. As the washing method, known methods can be used without particular limitation. Examples thereof include a method of immersing the container in a washing solution, a method of showering the liquid contact portion of the container with a washing solution, and the like. In a case where the container is immersed in a washing solution, ultrasonic washing can also be used.

As the washing solution, water and/or an organic solvent and the like can be used without particular limitation. Furthermore, the washing solution may be an acid or an alkali. The organic solvent that can be used as the washing solution is not particularly limited, and examples thereof include an organic solvent contained in the chemical liquid which will be described later.

<Chemical Liquid>

(Metal Component)

A chemical liquid is stored in the chemical liquid storage body according to the present embodiment. It is preferable that the chemical liquid contains water or an organic solvent. In a case where the stored chemical liquid contains one kind of specific metal component, the content thereof is equal to or smaller than 100 mass ppt. In a case where the stored chemical liquid contains two or more kinds of specific metal components, the total content thereof is equal to or smaller than 100 mass ppt.

The lower limit of the content of the metal component in the chemical liquid is not particularly limited. However, from the viewpoint of quantitative lower limit, the lower limit is preferably equal to or greater than 0.001 mass ppt, and more preferably equal to or greater than 0.01 mass ppt.

In the present specification, the specific metal component means the total content of specific metal ions and specific metal particles.

The type and the content of the specific metal ions and the specific metal particles in the chemical liquid can be measured by Single Nano Particle Inductively Coupled Plasma Mass Spectrometry (SP-ICP-MS).

The device used in SP-ICP-MS is the same as the device used in general inductively coupled plasma mass spectrometry (ICP-MS). The only difference between SP-ICP-MS and ICP-MS is how to analyze data. With SP-ICP-MS, data can be analyzed using commercial software.

With ICP-MS, the content of metal components as a measurement target is measured regardless of the way the metal components are present. Accordingly, the total mass of metal particles and metal ions as a measurement target is quantified as the content of metal components.

With SP-ICP-MS, the content of metal particles can be measured. Accordingly, by subtracting the content of metal particles from the content of metal components in a sample, the content of metal ions in the sample can be calculated.

Examples of the device for SP-ICP-MS include Agilent 8800 triple quadrupole inductively coupled plasma mass spectrometry (ICP-MS, for semiconductor analysis, option #200) manufactured by Agilent Technologies, Inc. By using this device, the content of metal particles can be measured by the method described in Examples. In addition to the device described above, it is possible to use NexION350S manufactured by PerkinElmer Inc. and Agilent 8900 manufactured by Agilent Technologies, Inc.

In the present specification, metal ions mean ions of a single metal or complex ions (for example, an amine complex, a cyano complex, a halogeno complex, a hydroxy complex, and the like).

In view of obtaining a chemical liquid storage body having further improved effects of the present invention, the content of the specific metal component in the chemical liquid (the content of one kind of specific metal component in a case where the chemical liquid contains one kind of specific metal component, or the total content of two or more kinds of specific metal components in a case where the chemical liquid contains two or more kinds of specific metal components) is preferably 0.01 to 50 mass ppt, and more preferably 0.01 to 40 mass ppt.

Specific Metal Particles

It is preferable that the chemical liquid contains specific metal particles. The content of the specific metal particles in the chemical liquid is not particularly limited. However, generally, the content of the specific metal particles is preferably 0.005 to 45 mass ppt, and more preferably 0.005 to 35 mass ppt. The specific metal particles readily cause short. In a case where the content of the specific metal particles in the chemical liquid is equal to or smaller than 45 mass ppt, the short inhibition performance of the chemical liquid storage body is further improved. In contrast, presumably, in a case where the content of the specific metal particles in the chemical liquid is equal to or greater than 0.005 mass ppt, a trace of the specific metal particles contained in the chemical liquid may be easily aggregated with each other, and consequently, the number of particles causing short may be reduced over time. As a result, the short inhibition performance of the chemical liquid storage body is further improved.

Specific Metal Ions

Furthermore, the chemical liquid may contain specific metal ions. The content of the specific metal ions in the chemical liquid is not particularly limited. Generally, the content of the specific metal ions is preferably 0.001 to 11 mass ppt, more preferably 0.001 to 10 mass ppt, and even more preferably 0.001 to 4 mass ppt.

(Organic Solvent)

It is preferable that the chemical liquid contains an organic solvent. The content of the organic solvent in the chemical liquid is not particularly limited. Generally, the content of the organic solvent with respect to the total mass of the chemical liquid is preferably equal to or greater than 98.0% by mass, more preferably equal to or greater than 99.0% by mass, even more preferably equal to or greater than 99.9% by mass, and particularly preferably equal to or greater than 99.99% by mass.

One kind of organic solvent may be used singly, or two or more kinds of organic solvents may be used in combination. In a case where two or more kinds of organic solvents are used in combination, the total content thereof is preferably within the above range.

In the present specification, an organic solvent means one liquid organic compound which is contained in the chemical liquid in an amount greater than 10,000 mass ppm with respect to the total mass of the chemical liquid. That is, in the present specification, a liquid organic compound contained in the chemical liquid in an amount greater than 10,000 mass ppm with respect to the total mass of the chemical liquid corresponds to an organic solvent.

In the present specification, "liquid" means that the compound stays in liquid form at 25° C. under atmospheric pressure.

The type of the organic solvent is not particularly limited, and examples thereof include known organic solvents.

Examples of the organic solvents include alkylene glycol monoalkyl ether carboxylate, alkylene glycol monoalkyl ether, a lactic acid alkyl ester, alkoxyalkyl propionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvents, those described in JP2016-057614A, JP2014-219664A, JP2016-138219A, and JP2015-135379A may be used.

The organic solvent is preferably at least one kind of compound selected from the group consisting of propylene glycol monomethyl ether (PGMM), propylene glycol monoethyl ether (PGME), propylene glycol monopropyl ether (PGMP), propylene glycol monomethyl ether acetate (PGMEA), ethyl lactate (EL), methyl methoxypropionate (MPM), cyclopentanone (CyPn), cyclohexanone (CyHe), γ-butyrolactone (γBL), diisoamyl ether (DIAE), butyl acetate (nBA), isoamyl acetate (iAA), isopropanol (IPA), 4-methyl-2-pentanol (MIBC), dimethylsulfoxide (DMSO), n-methyl-2-pyrrolidone (NMP), diethylene glycol (DEG), ethylene glycol (EG), dipropylene glycol (DPG), propylene glycol (PG), ethylene carbonate (EC), propylene carbonate (PC), sulfolane, cycloheptanone, 1-hexanol, decane, and 2-heptanone (MAK).

The type and the content of the organic solvent in the chemical liquid can be measured using a gas chromatography mass spectrometer. The measurement conditions are as described in Examples.

(Organic Impurities)

It is preferable that the chemical liquid contains organic impurities. The content of the organic impurities in the chemical liquid is not particularly limited. Generally, the content of the organic impurities with respect to the total mass of the chemical liquid is preferably equal to or smaller than 15,000 mass ppm, and more preferably equal to or smaller than 10,000 mass ppm. The lower limit thereof is not particularly limited. Generally, the lower limit is preferably equal to or greater than 100 mass ppm, and more preferably equal to or greater than 1,000 mass ppm.

In a case where the content of the organic impurities with respect to the total mass of the chemical liquid is equal to or smaller than 10,000 mass ppm, the short inhibition performance of the chemical liquid storage body is further improved.

In the present specification, the organic impurities mean an organic compound which is different from the organic solvent and contained in the chemical liquid in an amount equal to or smaller than 10,000 mass ppm with respect to the total mass of the organic solvent. That is, in the present specification, an organic compound contained in the chemical liquid in an amount equal to or smaller than 10,000 mass ppm with respect to the total mass of the organic solvent corresponds not to the organic solvent but to the organic impurities.

In a case where the organic solvent contains a plurality of kinds of organic compounds, and each of the organic compound is contained in the organic solvent in an amount equal to or smaller than 10,000 mass ppm as described above, each of the organic compounds corresponds to the organic impurities.

Examples of the organic impurities include compounds represented by the following Formulae I to V.

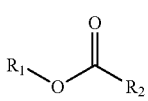

I

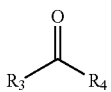

II

III

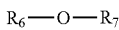

IV

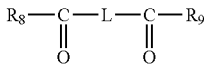

V

In Formula I, $R_1$ and $R_2$ each independently represent an amino group, an aryl group, an alkyl group, or a cycloalkyl group, or form a ring by being bonded to each other.

In a case where $R_1$ and $R_2$ each represent a group other than an amino group, the number of carbon atoms in $R_1$ and $R_2$ is not particularly limited. However, generally, the number of carbon atoms in $R_1$ and $R_2$ is 1 to 20 in many cases.

In Formula II, $R_3$ and $R_4$ each independently represent a hydrogen atom, an amino group, an aryl group, an alkyl group, an alkenyl group, a cycloalkyl group, or a cycloalkenyl group, or form a ring by being bonded to each other. Here, $R_3$ and $R_4$ do not simultaneously represent a hydrogen atom.

In a case where $R_3$ and $R_4$ each represent a group other than an amino group, the number of carbon atoms in $R_3$ and $R_4$ is not particularly limited. However, generally, the number of carbon atoms in $R_3$ and $R_4$ is 1 to 20 in many cases.

In Formula III, $R_5$ represents an alkyl group, an aryl group, or a cycloalkyl group. The number of carbon atoms in $R_5$ is 1 to 20 in many cases.

In Formula IV, $R_6$ and $R_7$ each independently represent an alkyl group, an aryl group, or a cycloalkyl group, or form a ring by being bonded to each other. The number of carbon atoms in $R_6$ and $R_7$ is not particularly limited. However, generally, the number of carbon atoms in $R_6$ and $R_7$ is 1 to 20 in many cases.

In Formula V, $R_8$ and $R_9$ each independently represent an alkyl group, an aryl group, an alkyloxy group, or a cycloalkyl group, or form a ring by being bonded to each other. L represents a single bond or a divalent linking group.

The number of carbon atoms in $R_5$ and $R_9$ is not particularly limited. However, generally, the number of carbon atoms in $R_8$ and $R_9$ is 1 to 20 in many cases.

Examples of the organic impurities also include a compound represented by Formula VI.

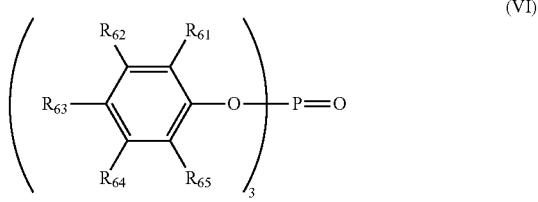

In Formula VI, $R_{61}$ to $R_{65}$ each independently represent an alkyl group. The number of carbon atoms in the alkyl group is not particularly limited. However, generally, the number of carbon atoms in the alkyl group is 1 to 10 in many cases.

Particularly, in view of obtaining a chemical liquid having further improved effects of the present invention, the organic impurities preferably contain at least one kind of compound selected from the group consisting of the compounds represented by the following Formulae (1) to (7). It is more preferable that the organic impurities are formed of at least one kind of compound selected from the group consisting of compounds represented by Formula (1) to (7).

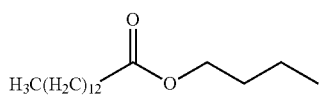

(1)

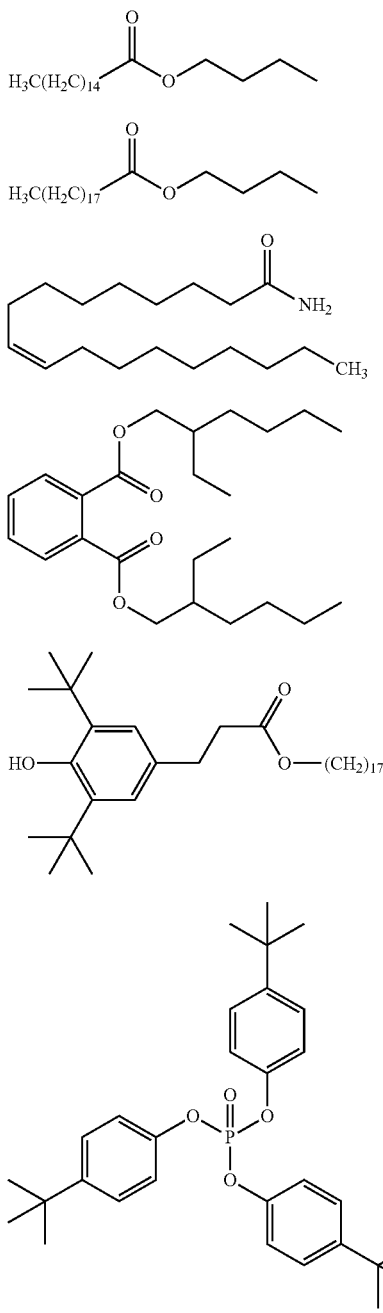

<Method for Manufacturing Chemical Liquid>

As the method for manufacturing the chemical liquid, known methods can be used without particular limitation.

Particularly, it is preferable that the method includes a purification step of purifying a substance to be purified so as to obtain the chemical liquid, because then the chemical liquid can be more simply obtained. Hereinafter, the step will be specifically described.

The substance to be purified used in the purification step is not particularly limited, and preferably contains water or an organic solvent. Such a substance to be purified can be prepared by purchase or obtained by reacting raw materials. As the substance to be purified, it is preferable to use a substance in which the content of the metal component and/or organic impurities described above is small. Examples of commercial products of such a substance to be purified include the substances called "high-purity grade products".

As the method for obtaining a substance to be purified (typically, a substance to be purified containing an organic solvent) by reacting raw materials, known methods can be used without particular limitation. Examples thereof include a method for obtaining an organic solvent by reacting a single raw material or a plurality of raw materials in the presence of a catalyst.

More specifically, examples of the method include a method for obtaining butyl acetate by reacting acetic acid and n-butanol in the presence of sulfuric acid; a method for obtaining 1-hexanol by reacting ethylene, oxygen, and water in the presence of $Al(C_2H_5)_3$; a method for obtaining 4-methyl-2-pentanol by reacting cis-4-methyl-2-pentene in the presence of Diisopinocamphenyl borane (Ipc2BH); a method for obtaining propylene glycol 1-monomethyl ether 2-acetate (PGMEA) by reacting propylene oxide, methanol and acetic acid in the presence of sulfuric acid; a method for obtaining isopropyl alcohol (IPA) by reacting acetone and hydrogen in the presence of copper oxide-zinc oxide-aluminum oxide; a method for obtaining ethyl lactate by reacting lactic acid and ethanol; and the like.

As the method for purifying the substance to be purified, known methods can be used without particular limitation. For example, it is preferable that the method for purifying the substance to be purified includes at least one kind of step selected from the group consisting of the steps described below. Hereinafter, each of the steps will be specifically described.

In the purification step, each of the following steps may be performed once or plural times. Furthermore, the order of the following steps is not particularly limited.

Distillation Step

Component Adjustment Step

The distillation step is a step of obtaining a distilled substance to be purified by distilling the substance to be purified. As the distillation method, known methods can be used without particular limitation.

Particularly, it is preferable to distill the substance to be purified by using the following purification device, because then a distilled substance to be purified can be more simply obtained, and the unintentional mixing of impurities into the purified substance in the distillation step becomes more difficult.

As an aspect of the purification device which can be used in the distillation step, for example, a purification device can be exemplified which has a distillation column for obtaining a purified substance by distilling the substance to be purified, in which a liquid contact portion (for example, an inner wall, a pipe line, or the like) of the distillation column is formed of at least one kind of material (hereinafter, referred to as "corrosion-resistance material" as well) selected from the group consisting of a nonmetallic material and an electropolished metallic material.

As the nonmetallic material, known materials can be used without particular limitation.

Examples of the nonmetallic material include at least one kind of material selected from the group consisting of a polyethylene resin, a polypropylene resin, a polyethylene-polypropylene resin, a polytetrafluoroethylene resin, a polytetrafluoroethylene-perfluoroalkyl vinyl ether copolymer resin, a polytetrafluoroethylene-hexafluoropropylene copolymer resin, a polytetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin. However, the present invention is not limited to these.

As the metallic material, known materials can be used without particular limitation.

Examples of the metallic material include a metallic material in which the total content of chromium and nickel with respect to the total mass of the metallic material is greater than 25% by mass. The total content of chromium and nickel is more preferably equal to or greater than 30% by mass. The upper limit of the total content of chromium and nickel in the metallic material is not particularly limited, but is preferably equal to or smaller than 90% by mass in general.

Examples of the metallic material include stainless steel, a nickel-chromium alloy, and the like.

As the stainless steel, known stainless steel can be used without particular limitation. Among these, an alloy with a nickel content equal to or higher than 8% by mass is preferable, and austenite-based stainless steel with a nickel content equal to or higher than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the nickel-chromium alloy, known nickel-chromium alloys can be used without particular limitation. Among these, a nickel-chromium alloy is preferable in which the nickel content is 40% to 75% by mass and the chromium content is 1% to 30% by mass.

Examples of the nickel-chromium alloy include HASTELLOY (trade name, the same is true for the following description), MONEL (trade name, the same is true for the following description), INCONEL (trade name, the same is true for the following description), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, if necessary, the nickel-chromium alloy may further contain boron, silicon, tungsten, molybdenum, copper, cobalt, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may become higher than the chromium content in the parent phase. Presumably, for this reason, from the distillation column in which the liquid contact portion is formed of an electropolished metallic material, the metal impurities containing metal atoms may not easily flow into the substance to be purified, and hence a substance to be purified (or a chemical liquid) having undergone distillation with a reduced impurity content can be obtained.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

As another aspect of the purification device which can be used in the distillation step, a purification device can be exemplified which comprises a reaction portion for obtaining a reactant, which is an organic solvent, by reacting raw materials, the distillation column described above, and a transfer pipe line which connects the reaction portion and the distillation column to each other so as to transfer the reactant to the distillation column from the reaction portion.

The reaction portion has a function of obtaining a reactant, which is an organic solvent, by reacting the supplied raw materials (if necessary, in the presence of a catalyst). As the reaction portion, known reaction portions can be used without particular limitation.

Examples of the reaction portion include an aspect comprising a reactor to which raw materials are supplied and in which a reaction proceeds, a stirring portion provided in the interior of the reactor, a lid portion joined to the reactor, an injection portion for injecting the raw materials into the reactor, and a reactant outlet portion for taking the reactant out of the reactor. By continuously or non-continuously injecting the raw materials into the reaction portion and reacting the injected raw materials (in the presence of a catalyst), a reactant which is an organic solvent can be obtained.

If desired, the reaction portion may also include a reactant isolation portion, a temperature adjustment portion, a sensor portion including a level gauge, a manometer, and a thermometer, and the like.

It is preferable that the liquid contact portion (for example, the interior wall of the liquid contact portion of the reactor, or the like) of the reaction portion is formed of at least one kind of material selected from the group consisting of a nonmetallic material and an electropolished metallic material. The aspect of each of the aforementioned materials is as described above.

In the purification device according to the above aspect, the reaction portion and the distillation column are connected to each other through the transfer pipe line. Because the reaction portion and the distillation column are connected to each other through the transfer pipe line, the transfer of the reactant to the distillation column from the reaction portion is carried out in a closed system, and impurities including metal components are inhibited from being mixed into the reactant from the environment.

As the transfer pipe line, known transfer pipe lines can be used without particular limitation. As the transfer pipe line, an aspect comprising a pipe, a pump, a valve, and the like can be exemplified.

It is preferable that the liquid contact portion of the transfer pipe line is formed of at least one kind of material selected from the group consisting of a nonmetallic material and an electropolished metallic material. The aspect of each of the aforementioned materials is as described above.

It is preferable that the purification step includes a component adjustment step.

The component adjustment step is a step of adjusting the content of the metal component, the organic impurities, and the like contained in the substance to be purified.

Examples of the method for adjusting the content of the metal component and the organic impurities contained in the substance to be purified include a method of adding the metal component, the organic impurities, and the like in a predetermined amount to the substance to be purified, a method of removing the metal component and the organic impurities from the substance to be purified, and the like.

As the method of removing the metal components and the organic impurities from the substance to be purified, known methods can be used without particular limitation.

As the method for removing the metal components and the organic impurities from the substance to be purified, for example, a method of filtering the substance to be purified through a filter (hereinafter, a step of performing the filtering will be referred to as "filtering step") is preferable. The method for passing the substance to be purified through a filter is not particularly limited, and examples thereof include a method of disposing a filter unit accommodating a filter cartridge having a filter in the middle of a transfer pipe line transferring the substance to be purified and passing the substance to be purified through the filter unit with or without applying pressure thereto.

As the filter, known filters can be used without particular limitation.

Filtering Step

It is preferable that the component adjustment step includes a filtering step.

As the filter used in the filtering step, known filters can be used without particular limitation.

The pore size of the filters is not particularly limited as long as it is generally used for filtering a substance to be purified. Especially, in view of obtaining a chemical liquid having further improved effects of the present invention, the pore size of the filters is preferably equal to or greater than 1.0 nm and equal to or smaller than 1.0 μm. In the present specification, the pore size of a filter means a pore size determined by the bubble point of isopropanol (IPA) or HFE-7200 ("NOVEC 7200", manufactured by 3M Company, hydrofluoroether, $C_4F_9OC_2H_5$).

The material of the filters is not particularly limited. In a case where the material is a resin, examples thereof include polyfluorocarbon such as polytetrafluoroethylene and perfluoroalkoxyalkane; polyamide such as nylon 6 and nylon 66; polyimide; polyamide imide; polyester; a polyolefin (including a high density polyolefin and an ultra-high-molecular-weight polyolefin) such as polyethylene and polypropylene (PP); polyether sulfone; cellulose; and the like.

Furthermore, in addition to a resin, diatomite, glass, and the like may also be used.

A surface treatment may be performed on the filters. As the surface treatment method, known methods can be used without particular limitation. Examples of the surface treatment method include a chemical modification treatment, a plasma treatment, a hydrophobization treatment, coating, a gas treatment, sintering, and the like.

The pore structure of the filters is not particularly limited, and may be appropriately selected according to the form of impurities contained in a substance to be purified. The pore structure of the filters means the pore size distribution, the positional distribution of pores in the filters, the shape of pores, and the like. Typically, the pore structure varies with the method for manufacturing the filters.

For example, the pore structure varies between a porous membrane formed by sintering powder of a resin or the like and a fibrous membrane formed by methods such as electrospinning, electroblowing, and melt blowing.

The critical surface tension of the filters is not particularly limited, and can be appropriately selected according to the impurities that should be removed. For example, in view of efficiently removing impurities with high polarity and metal impurities, the critical surface tension is preferably equal to or higher than 70 mN/m and equal to or lower than 95 mN/m. The critical surface tension of the filters is more preferably 75 to 85 mN/m. The value of the critical surface tension is a nominal value from the manufacturer.

The temperature at which a substance to be purified passes through the filters is not particularly limited, but is preferably less than room temperature in general.

There is no particular limitation on the value of a distance (Ra) between a substance to be purified and the material of each filter in the Hansen space and on the value of a radius of an interaction sphere, that is, the value of an interaction radius (R0) of the material of each filter. However, in view of reducing the amount of impurities derived from each filter that are eluted into the substance to be purified, it is preferable to control Ra and R0. That is, in a relationship among Hansen solubility parameters $\delta_{Dp}$, $\delta_{Pp}$, and $\delta_{Hp}$ and an interaction radius R0 of each filter and Hansen solubility parameters $\delta_{Ds}$, $\delta_{Ps}$, and $\delta_{Hs}$ of the substance to be purified, provided that Ra is represented by an equation of $Ra^2=4(\delta_{Ds}-\delta_{Dp})^2+(\delta_{Ps}-\delta_{Pp})^2+(\delta_{Hs}-\delta_{Hp})^2$, a ratio of Ra to R0 is preferably equal to or lower than 1.0.

The filtering speed is not particularly limited, but is preferably equal to or higher than 1.0 L/min/m², more preferably equal to or higher than 0.75 L/min/m², and even more preferably equal to or higher than 0.6 L/min/m².

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than 10.0 L/min/m² although the upper limit usually depends on the endurable differential pressure of the filter.

The filtering pressure is preferably 0.001 to 1.0 MPa, more preferably 0.003 to 0.5 MPa, and even more preferably 0.005 to 0.3 MPa. Particularly, in a case where a filter having a small pore size is used, by increasing the filtering pressure, it is possible to efficiently reduce the amount of impurities as particles in the substance to be purified. In a case where a filter having a pore size smaller than 20 nm is used, the filtering pressure is particularly preferably 0.005 to 0.3 MPa.

The filtering pressure affects the filtering accuracy. Therefore, it is preferable that the pulsation of pressure at the time of filtering is as low as possible.

In a case where two or more filters are used, the differential pressure before and after the substance to be purified passes through each of the filters (hereinafter, referred to as "differential pressure of filtering" as well) is not particularly limited, but is preferably equal to or lower than 250 kPa and more preferably equal to or lower than 200 kPa. The lower limit thereof is not particularly limited, but is preferably equal to or higher than 50 kPa. In a case where the differential pressure of filtering is equal to or lower than 250 kPa, it is possible to prevent an excessive pressure from being applied to the filter, and hence the amount of substances eluted expected to be reduced.

The smaller the pore size of the filtration filter, the lower the filtering speed. However, in a case where a plurality of filtration filters of the same type are connected to each other in parallel, the filtering area is enlarged, and the filtering pressure is reduced. Therefore, in this way, the reduction in the filtering speed can be compensated.

In a case where a substance to be purified is filtered using a plurality of filters, the pore size, the material, and the pore structure of the filters may be the same as each other. However, in a case where a plurality of filters, which are different from each other in terms of at least one kind of item selected from the group consisting of the pore size, the material, and the pore structure of the filters, are used in combination, it is possible to more effectively remove impurities in the substance to be purified.

In a case where the filtering device has a plurality of filter units, and the filter units are arranged in series in the pipe line, it is preferable that the filters included in the filter units are formed of a hydrophilic material and a hydrophobic material. In the present specification, a hydrophilic material means a material by which the water contact angle on the surface of the filter becomes equal to or greater than 45° at 25° C., and a hydrophobic material means a material by which the water contact angle on the surface of the filter becomes less than 45° at 25° C.

The filter formed of a hydrophilic material (hereinafter, referred to as "hydrophilic filter" as well) can efficiently remove metal impurities contained in a substance to be purified. In a case where such a filter is disposed at the end of the pipe line, that is, in a case where the substance to be purified is caused to finally pass through a hydrophilic filter, a chemical liquid with a reduced metal impurity content is obtained.

In a case where a plurality of filter units are used by being arranged in series in the pipe line, a differential pressure before and after a substance to be purified passes through each of the filter units is preferably equal to or higher than 50 kPa and equal to or lower than 250 kPa. In a case where the differential pressure is controlled within the above range, it is possible to prevent impurities from being eluted into the substance to be purified from the filters.

It is preferable to wash the filters by using a washing solution before purifying a substance to be purified. In a case where the filters are washed before the substance to be purified is used, it is possible to prevent impurities having adhered to the filters from migrating to the substance to be purified.

The washing solution is not particularly limited, and examples thereof include the organic solvent described above, the chemical liquid which will be described later, a solution obtained by diluting the chemical liquid, and the like.

The method for washing the filters is not particularly limited, and examples thereof include a method of passing the aforementioned washing solution through the filters set in the housing, a method of immersing the filters in the washing solution on the outside of the filtering device, and the like. In view of further inhibiting the mixing of impurities into the filtering device, it is preferable to use the method of immersing the filters in the washing solution on the outside of the filtering device.

In a case where a plurality of filter units are used by being arranged in series in the pipe line, the material and the pore structure of the filters are not particularly limited. At least one of the filters preferably contains nylon, and is more preferably formed of nylon.

The pore structure of the filter containing nylon is not particularly limited. However, it is preferable that the filter is a fibrous membrane.

From the viewpoint of efficiently removing metal particles and the like in a substance to be purified, it is preferable to use a filter having a pore size equal to or smaller than 20 nm. Particularly, in view of obtaining a chemical liquid having further improved effects of the present invention, the pore size is preferably 1.0 to 15 nm, and more preferably 1.0 to 12 nm. In a case where the pore size is equal to or smaller than 15 nm, a target substance can be more thoroughly removed. In a case where the pore size is equal to or greater than 1.0 nm, the filtering efficiency is further improved.

In a case where a plurality of filter units are arranged in series in the pipe line, and a substance to be purified contains a colloidalized target substance, it is preferable to dispose a filter having a larger pore size on a primary side of the filter for removing metal particles and the like.

For example, in a case where microfiltration filter having a pore size equal to or smaller than 20 nm is used for removing metal particles, by disposing a filter having a pore size equal to or greater than 50 nm on the primary side thereof, it is possible to further improve the filtering efficiency and to more thoroughly remove a particle-like target substance.

It is more preferable that the filtering step includes the following steps. In the filtering step, each of the following steps may be performed once or plural times. Furthermore, the order of the following steps is not particularly limited.
1. Particle removing step
2. Metal ion removing step
3. Organic impurity removing step Hereinafter, each of the steps will be described.

Particle Removing Step

The particle removing step is a step of removing particle-like impurities in the substance to be purified by using a particle removing filter. As the particle removing filter, known particle removing filters can be used without particular limitation.

Examples of the particle removing filter include a filter having a pore size equal to or smaller than 20 nm. In a case where the substance to be purified is filtered using the above filter, the particles-like impurities can be removed.

The pore size of the filter is preferably 1 to 15 nm, and more preferably 1 to 12 nm. In a case where the pore size of the filter is equal to or smaller than 15 nm, finer particle-like impurities can be removed. In a case where the pore size of the filter is equal to or greater than 1 nm, the filtering efficiency is improved.

A filter unit may be constituted with a plurality of filters described above. That is, the filter unit may further comprise a filter having a pore size equal to or greater than 50 nm. In a case where fine particles are present in the substance to be purified in addition to the colloidized impurities, particularly, the colloidized impurities containing metal atoms such as iron or aluminum, by filtering the substance to be purified by using a filter having a pore size equal to or greater than 50 nm before filtering the substance to be purified by using a filter having a pore size equal to or smaller than 20 nm, the filtering efficiency of the filter having a pore size equal to or smaller than 20 nm is improved, and the particle-like impurities removing performance is further improved.

Metal Ion Removing Step

It is preferable that the filtering step further includes a metal ion removing step.

As the metal ion removing step, a step of passing the substance to be purified through a metal ion adsorption filter is preferable. The method for passing the substance to be purified through the metal ion adsorption filter is not particularly limited, and examples thereof include a method for disposing a metal ion adsorption filter unit accommodating a filter cartridge having a metal ion adsorption filter in the middle of a transfer pipe line transferring the substance to be purified and passing the substance to be purified through the metal ion adsorption filter unit with or without applying pressure thereto.

The metal ion adsorption filter is not particularly limited, and examples thereof include known metal ion adsorption filters.

Particularly, as the metal ion adsorption filter, a filter capable of adsorbing the specific metal ions are preferable, because the specific metal ions readily become the cause of a defect in a semiconductor device. The material of the metal ion adsorption filter is not particularly limited, and it is preferable that the metal ion adsorption filter has an acid group such as a sulfo group or a carboxy group on the surface thereof.

Examples of the material of the metal ion adsorption filter include cellulose, diatomite, nylon, polyethylene, polypropylene, polystyrene, a fluorine-containing resin, and the like.

The metal ion adsorption filter may be constituted with material including polyimide and/or polyamide imide. Examples of the metal ion adsorption filter include the polyimide and/or polyamide imide porous membrane described in JP2016-155121A.

The polyimide and/or polyamide imide porous membrane may contain at least one group selected from the group consisting of a carboxy group, a salt-type carboxy group, and a —NH— bond. In a case where the metal ion adsorption filter is formed of a fluorine-containing resin, polyimide, and/or polyamide imide, the filter has further improved solvent resistance.

In the metal ion removing step, a filter may not be used. Examples of the method, in which a filter is not used, include a method of passing the substance to be purified through a column-like container (resin column) containing an ion exchange resin and/or an ion adsorption resin and a method of using an electrodialysis device using an ion exchange membrane.

As the ion exchange resin, a cation exchange resin or an anion exchange resin may be used as a single bed, a cation exchange resin and an anion exchange resin may be used as a dual bed, or a cation exchange resin and an anion exchange resin may be used as a mixed bed.

In order to reduce the amount of moisture eluted from the ion exchange resin, as the ion exchange resin, it is preferable to use a dry resin which does not contain moisture as far as possible. As the dry resin, commercial products can be used, and examples thereof include 15JS-HG•DRY (trade name, dry cation exchange resin, moisture: equal to or smaller than 2%) and MSPS2-1•DRY (trade name, mixed bed resin, moisture: equal to or smaller than 10%) manufactured by ORGANO CORPORATION, and the like.

Typically, examples of the ion adsorption include a method of using, instead of the ion exchange resin described above, an ion adsorption resin and/or a chelating agent having a function of entrapping metal ions in a substance to be purified. As the chelating agent, for example, it is possible to use the chelating agents described in JP2016-028021A, JP2000-169828A, and the like. Furthermore, as the ion adsorption resin, for example, it is possible to use the ion adsorption resins described in JP2001-123381A, JP2000-328449A, and the like.

In a case where an electrodialysis device using an ion exchange membrane is used, the substance to be purified can be treated at a high flow rate. The ion exchange membrane is not particularly limited, and examples thereof include NEOSEPTA (trade name, manufactured by ASTOM Corporation), and the like.

Organic Impurity Removing Step

It is preferable that the filtering step includes an organic impurity removing step. As the organic impurity removing step, a step of passing the substance to be purified through an organic impurity adsorption filter is preferable. The method for passing the substance to be purified through the organic impurity adsorption filter is not particularly limited, and examples thereof include a method for disposing a filter unit accommodating a filter cartridge having an organic impurity adsorption filter in the middle of a transfer pipe line transferring the substance to be purified and passing the organic solvent through the filter unit with or without applying pressure thereto.

The organic impurity adsorption filter is not particularly limited, and examples thereof include known organic impurity adsorption filters.

In view of improving the organic impurity adsorption performance, it is preferable that the organic impurity adsorption filter has the skeleton of an organic substance, which can interact with the organic impurity, on the surface thereof (in other words, it is preferable that the surface of the organic impurity adsorption filter is modified with the skeleton of an organic substance which can interact with the organic impurity). Examples of the skeleton of an organic substance which can interact with the organic impurities include a chemical structure which can react with the organic impurities so as to make the organic impurities trapped in the organic impurity adsorption filter. More specifically, in a case where the substance to be purified contains long-chain n-alkyl alcohol as an organic impurity (structural isomer in a case where long-chain 1-alkyl alcohol is used as an organic solvent), examples of the skeleton of an organic substance include an alkyl group. Furthermore, in a case where the organic impurities include dibutylhydroxytoluene (BHT), examples of the skeleton of an organic substance include a phenyl group.

Furthermore, as the organic impurity adsorption filter, it is possible to use the filters obtained by fixing active carbon to non-woven cloth that are described in JP2002-273123A and JP2013-150979A.

For the organic impurity adsorption filter, in addition to the chemical adsorption described above (adsorption using the organic impurity adsorption filter having the skeleton of an organic substance, which can interact with the organic impurity, on the surface thereof), a physical adsorption method can be used.

For example, in a case where the organic impurities contain BHT, the structure of BHT is larger than 10 Å (=1 nm). Accordingly, in a case where an organic impurity adsorption filter having a pore size of 1 nm is used, BHT cannot pass through the pore of the filter. That is, by being physically trapped by the filter, BHT is removed from the substance to be purified. In this way, for removing an organic impurity, not only a chemical interaction but also a physical removing method can be used. Here, in this case, a filter having a pore size equal to or greater than 3 nm is used as "particle removing filter", and a filter having a pore size less than 3 nm is used as "organic impurity adsorption filter".

In the present specification, 1 Å (angstrom) equals 0.1 nm.

Before being used, filters may be washed. The method for washing the filters is not particularly limited, and examples thereof include a method of immersing the filters in a washing solution, a method of passing a washing solution through the filters, and a method as a combination of these.

In a case where the filters are washed, it is easy to control the amount of components extracted from the filters, and consequently, a chemical liquid storage body having further improved effects of the present invention is obtained.

As the washing solution, known washing solutions can be used without particular limitation. The washing solution is not particularly limited, and examples thereof include water, an organic solvent, and the like. For example, the organic solvent may be alkylene glycol monoalkyl ether carboxylate, alkylene glycol monoalkyl ether, lactic acid alkyl ester, alkoxyalkyl propionate, cyclic lactone (preferably having 4 to 10 carbon atoms), a ketone compound which may have a ring (preferably having 4 to 10 carbon atoms), alkylene carbonate, alkoxyalkyl acetate, and alkyl pyruvate, and the like.

More specifically, examples of the washing solution include propylene glycol monomethyl ether, propylene glycol monomethyl ether acetate, dimethyl sulfoxide, N-methyl pyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-heptanone, γ-butyrolactone, a mixture of these, and the like.

A step of wetting filters with an organic solvent (for example, immersion) may be performed before the washing. In a case where the step of wetting filters with an organic solvent is performed in advance, wet particles are reduced, and the filtering efficiency is improved.

As the organic solvent used in the wetting step, the organic solvents described above can be used without particular limitation. Furthermore, although the organic solvent is not particularly limited, in a case where the surface tension of the organic solvent is lower than the surface tension of the organic solvent contained in the chemical liquid, the filtering efficiency is improved.

It is preferable that the organic solvent and the washing solution are high-purity products containing few impurities. The same is true for the organic solvent contained in the chemical liquid to be manufactured.

Moisture Adjustment Step

The moisture adjustment step is a step of adjusting the content of water contained in the substance to be purified. The method for adjusting the content of water is not particularly limited, and examples thereof include method for adding water to the substance to be purified and a method for removing water from the substance to be purified.

As the method for removing water, known dehydration methods can be used without particular limitation.

Examples of the method for removing water include a dehydration membrane, a water adsorbent insoluble in an organic solvent, an aeration purging device using dried inert gas, a heating device, a vacuum heating device, and the like.

In a case where the dehydration membrane is used, membrane dehydration by pervaporation (PV) or vapor permeation (VP) is performed. The dehydration membrane is constituted as a permeable membrane module, for example. As the dehydration membrane, it is possible to use a membrane formed of a polymeric material such as a polyimide-based material, a cellulose-based material, and a polyvinyl alcohol-based material or an inorganic material such as zeolite.

The water adsorbent is used by being added to the substance to be purified. Examples of the water adsorbent include zeolite, diphosphorus pentoxide, silica gel, calcium chloride, sodium sulfate, magnesium sulfate, anhydrous zinc chloride, fuming sulfuric acid, soda lime, and the like.

In a case where zeolite (particularly, MOLECULAR SIEVE (trade name) manufactured by Union Showa K. K.) is used in the dehydration treatment, olefins can also be removed.

The component adjustment step described above is preferably performed under a sealed condition in an inert gas atmosphere in which water is less likely to be mixed into the substance to be purified.

Furthermore, in order to inhibit the mixing of moisture as much as possible, each of the treatments is preferably performed in an inert gas atmosphere in which a dew-point temperature is equal to or lower than −70° C. This is because in the inert gas atmosphere at a temperature equal to or lower than −70° C., the concentration of moisture in a gas phase is equal to or lower than 2 mass ppm, and hence the likelihood that moisture will be mixed into the organic solvent is reduced.

The manufacturing method of a chemical liquid may include, in addition to the above steps, the adsorptive purification treatment step for metal components using silicon carbide described in WO2012/043496A.

(Other Steps)

The manufacturing method of a chemical liquid may include other steps. Those other steps are not particularly limited, and examples thereof include an electricity removing step.

The electricity removing step is a step of removing electricity from the substance to be purified such that the charge potential of the substance to be purified is reduced.

As the electricity removing method, known electricity removing methods can be used without particular limitation. Examples of the electricity removing method include a method for bringing the substance to be purified into contact with a conductive material.

The contact time for which the substance to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method for bringing the substance to be purified into contact with a conductive material include a method for disposing a grounded mesh formed of a conductive material in the interior of a pipe line and passing the substance to be purified through the mesh, and the like.

During the purification of a chemical liquid, it is preferable that all of the opening of a container, washing of a container and a device, storage of a solution, analysis, and the like that are included in the purification are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

<Use of Chemical Liquid>

It is preferable that the chemical liquid purified by the above purification method is used for manufacturing semiconductor devices. Specifically, it is preferable that the chemical liquid is used for treating organic substances and the like in a wiring forming process (including a lithography step, an etching step, an ion implantation step, a peeling step, and the like) including photolithography. More specifically, the chemical liquid is preferably used as a prewet solution, a developer, a rinsing solution, a peeling solution, a CMP slurry, a washing solution used after CMP (rinsing solution used after p-CMP), and the like.

The rinsing solution can be used for rinsing the edge line of a wafer before and after being coated with a resist solution.

Furthermore, the chemical liquid can be used as a diluent for a resin contained in a composition for forming a resist film (resist composition) used for manufacturing semiconductor devices. That is, the chemical liquid can be used as a solvent for the composition for forming a resist film.

In addition, the chemical liquid may be used by being diluted with another organic solvent and/or water, and the like.

In a case where the chemical liquid is used as a CMP slurry, for example, abrasive grains, an oxidant, and the like may be added to the chemical liquid. Moreover, the chemical liquid can also be used as a solvent for diluting a CMP slurry.

The chemical liquid can be suitably used for other purposes in addition to the manufacturing of semiconductor devices. The chemical liquid can be used as a developer for polyimide, a resist for sensor, and a resist for lens, a rinsing solution, and the like.

In addition, the chemical liquid can also be used as a solvent for medical uses or for washing. Particularly, the chemical liquid can be suitably used for washing containers, piping, substrates (for example, a wafer and glass), and the like.

The chemical liquid storage body can be manufactured by storing a chemical liquid in the container described above. As the method for storing the chemical liquid in the container, known methods can be used without particular limitation. In a case where the chemical liquid is stored in the container, it is preferable that the chemical liquid is stored in the container in the clean room described above.

In the chemical liquid storage body, a void volume in the container that is calculated by the following equation is not particularly limited, but is preferably 5% to 40% by volume.

Equation: void volume={1−(volume of chemical liquid in container/volume of container)}×100

There is no particular limitation on the number of particles having a particle diameter equal to or greater than 0.05 μm in a void portion of the container in the chemical liquid storage body (a region without the chemical liquid in the container). However, in view of further improving the defect inhibition performance, the number of particles having a particle diameter equal to or greater than 0.05 μm in the void portion is preferably 1 to 1,000/m$^3$, and more preferably 3 to 60/m$^3$.

The number of such particles is measured by the method described in Examples which will be described later.

There is no particular limitation on the number of particles having a particle diameter equal to or greater than 0.05 μm in the chemical liquid stored in the chemical liquid storage body. However, in view of further improving defect inhibition performance, the number of particles having a particle diameter equal to or greater than 0.05 μm is preferably 5 to 500/ml.

The number of such particles is measured by the method described in Examples which will be described later.

There is no particular limitation on the concentration of an organic phosphorus compound in the void portion of the container in the chemical liquid storage body. However, in view of further improving the defect inhibition performance, the concentration of the organic phosphorus compound is preferably 0.01 to 100 volume ppb.

The organic phosphorus compound means a compound containing phosphorus atoms.

The concentration of the organic phosphorus compound is measured by the method described in Examples which will be described later.

[Second Embodiment of Chemical Liquid Storage Body]

Hereinafter, a second embodiment of the chemical liquid storage body of the present invention will be described. In the following section, the same items as those in the chemical liquid storage body according to the first embodiment will not be specifically described.

The chemical liquid storage body according to the second embodiment of the present invention is a container having a base material and a coating layer which is on the base material and formed of specific glass, in which A/B measured by a predetermined method is higher than 0.10 and less than 1.0 in at least a portion of a liquid contact portion of the container.

The shape of the coating layer, the range coated by the coating layer, and the like are not particularly limited as long as the coating layer is formed on the base material. However, in view of obtaining a chemical liquid storage body having further improved effects of the present invention, within base material, the coating layer is preferably disposed on at least a part of a portion constituting the liquid contact portion of the formed container, and more preferably disposed on the entirety of the liquid contact portion. It is even more preferable that the inner wall surface of the container is formed of the coating layer.

The thickness of the coating layer is not particularly limited, but is preferably 5 to 30 μm in general.

As the base material, base materials generally used in containers can be used without particular limitation. Particularly, in view of obtaining a chemical liquid storage body having further improved effects of the present invention, the base material preferably contains glass (including the specific glass) and/or the corrosion-resistance material described above. The base material is more preferably formed of glass or the corrosion-resistance material.

The thickness of the base material is not particularly limited, but is preferably 1 to 5 mm in general.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

At the time of manufacturing chemical liquid storage bodies of examples and comparative examples, all of the handling of containers and the preparation, filling, preservation, analysis, and measurement of chemical liquids were performed in a clean room that meets a level equal to or lower than the ISO Class 2. In a case where the organic impurities and the specific metal component were measured using a sample which was found to contain the organic impurities and the specific metal component in an amount equal to or smaller than a detection limit by general measurement, in order to improve the measurement accuracy, the sample was measured after being concentrated by 1/100 in terms of the volume, and the content of the organic impurities and the specific metal component was calculated by being converted into the concentration of the solution not yet being concentrated.

Example 1

As a container, a chemical 3600A manufactured by Toyo Glass Co., Ltd. was prepared and washed under the conditions described in Table 1. The container was formed of glass containing sodium atoms, and the inner wall surface of the container had been subjected to a silica coating treatment. The silica coating treatment is a treatment of heating silyl tetraisocyanate silane so as to gasifying the compound and blowing the gasified compound into the container. The composition of the gas blown into the container is shown in Table 1. The silica coating treatment was performed with reference to what is described in paragraph "0035" in JP2003-128439A.

Then, the container having undergone the silica coating treatment was washed under the washing conditions described in Table 1. In the column of "Washing conditions" in Table 1, the number of times of washing and the condition for ultrasonic washing (frequency) are described. The output of the ultrasonic washing machine was 250 W. "Rinsing" means that water was used as a washing solution.

For this container, the content of sodium atoms, $SiO_2$, and calcium atoms was measured by XPS. XPS was performed under the following conditions.

XPS was performed using a scanning type X-ray photoelectron spectrometer PHI 5000 Versa Probe II manufactured by ULVAC-PHI, INCORPORATED. Specifically, by using a depth profile, XPS was performed on a surface etched using Ar ions at 2 nm/min at a degree of vacuum of $1.4 \times 10^{-7}$ Torr.

Within the surface region, XPS was performed at six spots at an interval of 2 nm (0 nm, 2 nm, 4 nm, 6 nm, 8 nm, and 10 nm), and the arithmetic mean of the obtained results was calculated.

Furthermore, within the bulk region, XPS was performed at four spots at an interval of 500 nm (500 nm, 1,000 nm, 1,500 nm, and 2,000 nm), and the arithmetic mean of the obtained results was calculated.

In the measurement data obtained by XPS, the content of each atom was obtained as at %. Therefore, the content represented by at % was converted into the content (% by mass) of each atom with respect to the total mass of each of the measurement regions. Furthermore, the content of $SiO_2$ was calculated on the assumption that all the detected Si was derived from $SiO_2$. The results are shown in Table 1.

Then, a substance to be purified containing PGMEA as an organic solvent (manufactured by Toyo Gosei Co., Ltd., PGMEA having purity of 99.9%) was prepared and purified, thereby obtaining a chemical liquid. For purifying the substance to be purified, a filtering device was used. The filtering device used had a tank, two filter units each accommodating a filter cartridge, and a filling portion, and these were connected to each other through a pipe line. By a pump disposed in the pipe line, the substance to be purified was transported to the filling portion from the tank, and passed through the filter units while being transported. In this process, the substance to be purified was purified. The two filter units were connected to each other in series in the direction along which the substance to be purified flowed. That is, the substance to be purified sequentially passed through two filters, and in this process, the substance to be purified was purified.

In each of the two filter units, the following filter cartridges were accommodated from a primary side. In a case where the substance to be purified passed once through each of the following filters, it was considered that purification of the substance to be purified was finished (the substance to be purified was not circulated in the filtering device).

Primary side: made of nylon, pore size: 20 nm, porous membrane filter
Secondary side: made of PTFE, pore size: 15 nm, porous membrane filter For the obtained chemical liquid that was just prepared, the type and content of the specific metal component and the organic impurities and the content of the organic solvent were measured by the following methods. The results are shown in Table 1.

The chemical liquid was stored in a container, thereby obtaining a chemical liquid storage body.

(Measurement of Type and Content of Organic Impurities and Content of Organic Solvent)

The type and content of the organic impurities and the organic solvent in the chemical liquid were measured under the following conditions by using a gas chromatography mass spectrometer (trade name: "GCMS-2020", manufactured by Shimadzu Corporation).

Capillary column: InertCap 5MS/NP 0.25 mmI.D.×30 m df=0.25 μm
Sample introduction method: slit 75 kPa constant pressure
Vaporizing chamber temperature: 230° C.
Column oven temperature: 80° C. (2 min)–500° C. (13 min) heating rate 15° C./min
Carrier gas: helium
Septum purge flow rate: 5 mL/min
Split ratio: 25:1
Interface temperature: 250° C.
Ion source temperature: 200° C.
Measurement mode: Scan m/z=85~500
Amount of sample introduced: 1 μL (Content of Specific Metal Component by Type)

The content of the specific metal component (the specific metal ions and the specific metal particles) in the chemical liquid by type was measured under the following conditions by using Agilent 8800 triple quadrupole ICP-MS (for semiconductor analysis, option #200).

As a sample introduction system, a quartz torch, a coaxial perfluoroalkoxyalkane (PFA) nebulizer (for self-suction), and a platinum interface cone were used. The measurement parameters of cool plasma conditions are as below.

Output of Radio Frequency (RF) (W): 600
Flow rate of carrier gas (L/min): 0.7
Flow rate of makeup gas (L/min): 1
Sampling depth (mm): 18

[Preparation of Chemical Liquid Storage Bodies of Other Examples and Comparative Examples]

Table 1 shows containers and the composition of chemical liquids that were used for preparing the chemical liquid storage bodies of examples and comparative examples.

First, in the column of "Method for preparing container", the commercial glass containers used for preparing the chemical liquid storage bodies, the conditions for the silica coating treatment, and the washing conditions (after the silica coating treatment) were described. In the column of "Container formed of glass containing sodium atoms", "Different lot" means that the bottle is a product that has the same model number as other products but is different from other products in terms of the lot number of the manufacturer.

In the column of "Silica coating treatment", "20/80" or the like shows the composition (volume/volume) of a gas $(Si(NCO)_4/O_2)$ blown to the inner wall of a container at the time of silica coating treatment. The ultrasonic washing machine used for washing after the silica coating treatment in examples and comparative examples had an output of 250 W.

Then, the results obtained by measuring the content of sodium atoms, $SiO_2$, and calcium atoms in the container prepared as above by XPS were described in the column of "Content of Na, $SiO_2$, and Ca in container". The content was measured by the method described above.

The composition of each of the chemical liquids stored in each container was described in the column of "Composition of chemical liquid". Each of the chemical liquids contained the organic impurities, the specific metal component, and an organic solvent described in each line of Table 1 as balance. In the Table, the content of the organic impurities and the specific metal component represents the ratio thereof with respect to the total mass of the chemical liquid. Each of the components was measured by the method described above.

[Evaluation]

Each of the chemical liquid storage bodies was preserved under the following preservation condition. Then, the chemical liquid was taken out of each of the containers and evaluated as below.

(Preservation Condition)

After being prepared, each of the chemical liquid storage bodies was preserved for 7 days at 25° C. and then evaluated.

(Defect Inhibition Performance)

The chemical liquid was taken out of each of the chemical liquid storage bodies after preservation, and the defect inhibition performance thereof was evaluated by the following method.

First, a silicon oxide film substrate having a diameter of 300 mm was prepared.

Then, by using a wafer surface inspection device (SP-5; manufactured by KLA-Tencor Corporation), the number of particles having a diameter equal to or greater than 19 nm that were present on the substrate was counted (the counted number was adopted as an initial value). Thereafter, the substrate was set in a spin jetting device, and while the substrate was being rotated, each of the chemical liquids was jetted to the surface of the substrate at a flow rate of 1.5 L/min. Subsequently, the substrate was spin-dried.

Then, by using the device (SP-5), the number of particles present on the substrate after being coated with the chemical liquid was counted (the counted number was adopted as a counted value). Thereafter, a difference between the initial value and the counted value (counted value−initial value) was calculated. Based on the following standards, the obtained results were evaluated. The results are shown in the column of "Defect inhibition performance (after preservation)" in Table 1.

"A": The difference between the initial value of the number of particles and the counted value of the number of particles was equal to or smaller than 100.

"B": The difference between the initial value of the number of particles and the counted value of the number of particles was greater than 100 and equal to or smaller than 300.

"C": The difference between the initial value of the number of particles and the counted value of the number of particles was greater than 300 and equal to or smaller than 500.

"D": The difference between the initial value of the number of particles and the counted value of the number of particles was greater than 500 and equal to or smaller than 1,000.

"E": The difference between the initial value of the number of particles and the counted value of the number of particles was greater than 1,000 and equal to or smaller than 3,000.

"F": The difference between the initial value of the number of particles and the counted value of the number of particles was greater than 3,000.

(Short Inhibition Performance)

The chemical liquid was taken out of the chemical liquid storage body after preservation, and the short inhibition performance thereof was evaluated by the following method.

By using each of the chemical liquids described in examples and comparative examples as a prewet solution, a Metal Oxide Semiconductor Field Effect Transistor (MOSFET) type test substrate was prepared by a photoresist process. For the obtained test substrate, a Time Dependent Dielectric Breakdown (TDDB) test was performed, and the short inhibition performance of the chemical liquid was evaluated. Specifically, in an environment at 25° C., a constant current density of 20 mA/cm$^2$ was applied to the test substrate, and the total quantity of electric charge Qbd [unit: C/cm$^2$] applied until the electric breakdown of a gate insulating film occurred was measured. The results were evaluated based on the following standards, and shown in the column of "Short inhibition performance (after preservation)" in Table 1.

A: The total quantity of electric charge Qbd was equal to or greater than 0.75 [C/cm$^2$].

B: The total quantity of electric charge Qbd was equal to or greater than 0.60 [C/cm$^2$] and less than 0.75 [C/cm$^2$].

C: The total quantity of electric charge Qbd was equal to or greater than 0.45 [C/cm$^2$] and less than 0.60 [C/cm$^2$].

D: The total quantity of electric charge Qbd was equal to or greater than 0.30 [C/cm$^2$] and less than 0.45 [C/cm$^2$].

E: The total quantity of electric charge Qbd was equal to or greater than 0.15 [C/cm$^2$] and less than 0.30 [C/cm$^2$].

F: The total quantity of electric charge Qbd was less than 0.15 [C/cm$^2$].

TABLE 1-1

| | Preparation of chemical liquid storage body Container Method for preparing container | |
| --- | --- | --- |
| | Container formed of glass containing Na atoms | Condition of silica coating treatment $Si(NCO)_4/O_2$ (volume ratio of gas) |
| Example 1 | Chemical 3600A manufactured by Toyo Glass Co., Ltd. | 10/90 |
| Example 2 | | |
| Example 3 | | |
| Example 4 | | |
| Example 5 | | |
| Example 6 | | |
| Example 7 | | |
| Example 8 | | |
| Example 9 | | |
| Example 10 | | |
| Example 11 | | |
| Example 12 | Gallon bottle (with lid) manufactured by SEKIYARIKA CO., LTD. | 20/80 |
| Example 13 | | 30/70 |
| Example 14 | | 40/60 |
| Example 15 | | 50/50 |
| Example 16 | | 80/20 |
| Example 17 | Chemical 3600A manufactured by Toyo Glass Co., Ltd., different lot | 10/90 |
| Example 18 | Gallon bottle for tea manufactured by GLASEL CO., LTD, 3.6 L, PV | 30/70 |
| Example 19 | Gallon bottle (with lid) manufactured by SEKIYARIKA CO., LTD., different lot | 40/60 |
| Example 20 | Gallon bottle (with lid) manufactured by SEKIYARIKA CO., LTD. | 50/50 |

TABLE 1-1-continued

| | Preparation of chemical liquid storage body Container Method for preparing container | |
|---|---|---|
| | Container formed of glass containing Na atoms | Condition of silica coating treatment Si(NCO)$_4$/O$_2$(volume ratio of gas) |
| Example 21 | Chemical 3600A manufactured by Toyo Glass Co., Ltd., different lot | 10/90 |
| Example 22 | Chemical 3600A manufactured by Toyo Glass Co., Ltd., different lot | |
| Example 23 | Chemical 3600A manufactured by Toyo Glass Co., Ltd., different lot | |
| Example 24 | Chemical 3600A manufactured by Toyo Glass Co., Ltd., different lot | |
| Example 25 | Chemical 3600A manufactured by Toyo Glass Co., Ltd., different lot | |
| Example 26 | Chemical 3600A manufactured by Toyo Glass Co., Ltd., different lot | |
| Example 27 | Chemical 3600A manufactured by Toyo Glass Co., Ltd., different lot | |
| Example 28 | Chemical 3600A manufactured by Toyo Glass Co., Ltd., different lot | |
| Comparative Example 1 Comparative Example 2 Comparative Example 3 | Chemical 3600A manufactured by Toyo Glass Co., Ltd. | |

TABLE 1-1

| | Preparation of chemical liquid storage body Container | | | | | | | |
|---|---|---|---|---|---|---|---|---|
| | Method for preparing container Washing conditions | | Content of Na, SiO$_2$, and Ca in container | | | | | |
| | | | Content of Na atoms (% by mass) | | | Content of SiO$_2$ (% by mass) | | |
| | Rinsing Number of times | Ultrasound Frequency | A Surface region | B Bulk region | A/B Content mass ratio | C Surface region | D Bulk region | C/D Content mass ratio |
| Example 1 | 5 | 40 kHz | 0.15 | 1.0 | 0.15 | 96.0 | 80.0 | 1.20 |
| Example 2 | | | 0.15 | 1.0 | 0.15 | 96.0 | 80.0 | 1.20 |
| Example 3 | | | 0.15 | 1.0 | 0.15 | 96.0 | 80.0 | 1.20 |
| Example 4 | | | 0.15 | 1.0 | 0.15 | 96.0 | 80.0 | 1.20 |
| Example 5 | 2 | 40 kHz | 0.80 | 1.0 | 0.80 | 96.0 | 80.0 | 1.20 |
| Example 6 | 1 | 40 kHz | 0.90 | 1.0 | 0.90 | 96.0 | 80.0 | 1.20 |
| Example 7 | 5 | 50 kHz | 0.075 | 0.5 | 0.15 | 96.0 | 80.0 | 1.20 |
| Example 8 | 1 | 15 kHz | 3.3 | 22 | 0.15 | 96.0 | 80.0 | 1.20 |
| Example 9 | 1 | 30 kHz | 1.5 | 10 | 0.15 | 96.0 | 80.0 | 1.20 |
| Example 10 | 1 | 25 kHz | 2.1 | 14 | 0.15 | 96.0 | 80.0 | 1.20 |
| Example 11 | 1 | 20 kHz | 2.7 | 18 | 0.15 | 96.0 | 80.0 | 1.20 |
| Example 12 | 5 | 40 kHz | 0.15 | 1.0 | 0.15 | 96.0 | 64.0 | 1.50 |
| Example 13 | | | 0.15 | 1.0 | 0.15 | 89.6 | 64.0 | 1.40 |
| Example 14 | | | 0.15 | 1.0 | 0.15 | 83.2 | 64.0 | 1.30 |
| Example 15 | | | 0.15 | 1.0 | 0.15 | 76.8 | 64.0 | 1.20 |
| Example 16 | | | 0.15 | 1.0 | 0.15 | 57.6 | 64.0 | 0.900 |
| Example 17 | | | 0.15 | 1.0 | 0.15 | 99.6 | 83.0 | 1.20 |
| Example 18 | | | 0.15 | 1.0 | 0.15 | 90.0 | 75.0 | 1.20 |
| Example 19 | | | 0.15 | 1.0 | 0.15 | 81.6 | 68.0 | 1.20 |
| Example 20 | | | 0.15 | 1.0 | 0.15 | 76.8 | 64.0 | 1.20 |
| Example 21 | | | 0.15 | 1.0 | 0.15 | 96.0 | 80.0 | 1.20 |
| Example 22 | | | 0.15 | 1.0 | 0.15 | 96.0 | 80.0 | 1.20 |
| Example 23 | | | 0.15 | 1.0 | 0.15 | 96.0 | 80.0 | 1.20 |
| Example 24 | | | 0.15 | 1.0 | 0.15 | 96.0 | 80.0 | 1.20 |
| Example 25 | | | 0.15 | 1.0 | 0.15 | 96.0 | 80.0 | 1.20 |
| Example 26 | | | 0.15 | 1.0 | 0.15 | 96.0 | 80.0 | 1.20 |
| Example 27 | | | 0.15 | 1.0 | 0.15 | 96.0 | 80.0 | 1.20 |
| Example 28 | | | 0.15 | 1.0 | 0.15 | 96.0 | 80.0 | 1.20 |
| Comparative Example 1 | 3 | 40 kHz | 0.6 | 1.0 | 0.60 | 96.0 | 80.0 | 1.20 |
| Comparative Example 2 | 0 | 40 kHz | 1.0 | 1.0 | 1.0 | 96.0 | 80.0 | 1.20 |
| Comparative Example 3 | 6 | 40 kHz | 0.10 | 1.0 | 0.10 | 96.0 | 80.0 | 1.20 |

TABLE 1-3

| | Preparation of chemical liquid storage body | | | | |
|---|---|---|---|---|---|
| | Container Content of Na, SiO$_2$, and Ca in container Content of Ca atoms (% by mass) | | | Chemical liquid Composition Organic solvent | |
| | E Surface region | F Bulk region | E/F Content mass ratio | Type | Content (based on mass) |
| Example 1 | 0.016 | 0.12 | 0.13 | PGMEA | Balance |
| Example 2 | 0.016 | 0.12 | 0.13 | Cyclohexanone | Balance |
| Example 3 | 0.016 | 0.12 | 0.13 | Ethyl lactate | Balance |
| Example 4 | 0.016 | 0.12 | 0.13 | Butyl acetate | Balance |
| Example 5 | 0.016 | 0.12 | 0.13 | MIBC | Balance |
| Example 6 | 0.016 | 0.12 | 0.13 | NMP | Balance |
| Example 7 | 0.016 | 0.12 | 0.13 | MAK | Balance |
| Example 8 | 0.016 | 0.12 | 0.13 | PGMEA | Balance |
| Example 9 | 0.016 | 0.12 | 0.13 | Ethyl lactate | Balance |
| Example 10 | 0.016 | 0.12 | 0.13 | PGMEA | Balance |
| Example 11 | 0.016 | 0.12 | 0.13 | Cyclohexanone | Balance |
| Example 12 | 0.016 | 0.12 | 0.13 | n-Pentyl acetate | Balance |
| Example 13 | 0.016 | 0.12 | 0.13 | Ethylene glycol | Balance |
| Example 14 | 0.016 | 0.12 | 0.13 | Isopentyl acetate | Balance |
| Example 15 | 0.016 | 0.12 | 0.13 | PGMEA | Balance |
| Example 16 | 0.016 | 0.12 | 0.13 | Butyl acetate | Balance |
| Example 17 | 0.016 | 0.12 | 0.13 | PGME | Balance |
| Example 18 | 0.016 | 0.12 | 0.13 | MEK | Balance |
| Example 19 | 0.016 | 0.12 | 0.13 | 1-Hexanol | Balance |
| Example 20 | 0.016 | 0.12 | 0.13 | Decane | Balance |
| Example 21 | 0.011 | 0.12 | 0.09 | PGMEA | Balance |
| Example 22 | 0.072 | 0.12 | 0.60 | Cyclohexanone | Balance |
| Example 23 | 0.084 | 0.12 | 0.70 | Ethyl lactate | Balance |
| Example 24 | 0.11 | 0.12 | 0.93 | Butyl acetate | Balance |
| Example 25 | 0.0065 | 0.050 | 0.13 | MAK | Balance |
| Example 26 | 1.17 | 9.0 | 0.13 | PGMEA | Balance |
| Example 27 | 1.82 | 14 | 0.13 | Cyclohexanone | Balance |
| Example 28 | 1.95 | 15 | 0.13 | Ethyl lactate | Balance |
| Comparative Example 1 | 0.016 | 0.12 | 0.13 | MAK | Balance |
| Comparative Example 2 | 0.016 | 0.12 | 0.13 | MAK | Balance |
| Comparative Example 3 | 0.016 | 0.12 | 0.13 | MAK | Balance |

TABLE 1-4

| | Preparation of chemical liquid storage body Chemical liquid | | | | Evaluation | |
|---|---|---|---|---|---|---|
| | Composition | | | | Short | Defect |
| | Content of specific metal (Fe, Al, Cr, or Ni) component | | | Content of organic | inhibition performance | inhibition performance |
| | Ions (mass ppt) | Particles (mass ppt) | Total (mass ppt) | impurities (mass ppt) | (after preservation) | (after preservation) |
| Example 1 | 0.001 | 0.009 | 0.01 | 2,000 | A | A |
| Example 2 | 0.001 | 0.009 | 0.01 | 11,000 | B | A |
| Example 3 | 5 | 45 | 50 | 2,000 | B | A |
| Example 4 | 11 | 89 | 100 | 2,000 | C | A |
| Example 5 | 0.001 | 0.009 | 0.01 | 2,000 | B | A |
| Example 6 | 0.001 | 0.009 | 0.01 | 2,000 | C | A |
| Example 7 | 0.001 | 0.009 | 0.01 | 2,000 | A | C |
| Example 8 | 0.001 | 0.009 | 0.01 | 2,000 | E | A |
| Example 9 | 0.001 | 0.009 | 0.01 | 2,000 | B | A |
| Example 10 | 0.001 | 0.009 | 0.01 | 2,000 | C | A |
| Example 11 | 0.001 | 0.009 | 0.01 | 2,000 | D | A |
| Example 12 | 0.001 | 0.009 | 0.01 | 2,000 | A | C |
| Example 13 | 0.001 | 0.009 | 0.01 | 2,000 | B | A |
| Example 14 | 0.001 | 0.009 | 0.01 | 2,000 | C | A |
| Example 15 | 0.001 | 0.009 | 0.01 | 2,000 | D | A |
| Example 16 | 0.001 | 0.009 | 0.01 | 2,000 | E | A |
| Example 17 | 0.001 | 0.009 | 0.01 | 2,000 | A | C |
| Example 18 | 0.001 | 0.009 | 0.01 | 2,000 | B | A |

TABLE 1-4-continued

| | Preparation of chemical liquid storage body Chemical liquid | | | | Evaluation | |
|---|---|---|---|---|---|---|
| | Composition | | | | Short | Defect |
| | Content of specific metal (Fe, Al, Cr, or Ni) component | | | Content of organic | inhibition performance | inhibition performance |
| | Ions (mass ppt) | Particles (mass ppt) | Total (mass ppt) | impurities (mass ppt) | (after preservation) | (after preservation) |
| Example 19 | 0.001 | 0.009 | 0.01 | 2,000 | C | A |
| Example 20 | 0.001 | 0.009 | 0.01 | 2,000 | D | A |
| Example 21 | 0.001 | 0.009 | 0.01 | 2,000 | A | C |
| Example 22 | 0.001 | 0.009 | 0.01 | 2,000 | B | A |
| Example 23 | 0.001 | 0.009 | 0.01 | 2,000 | C | A |
| Example 24 | 0.001 | 0.009 | 0.01 | 2,000 | D | A |
| Example 25 | 0.001 | 0.009 | 0.01 | 2,000 | A | C |
| Example 26 | 0.001 | 0.009 | 0.01 | 2,000 | B | A |
| Example 27 | 0.001 | 0.009 | 0.01 | 2,000 | C | A |
| Example 28 | 0.001 | 0.009 | 0.01 | 2,000 | D | A |
| Comparative Example 1 | 11 | 108 | 119 | 2,000 | F | A |
| Comparative Example 2 | 0.001 | 0.009 | 0.01 | 2,000 | F | A |
| Comparative Example 3 | 0.001 | 0.009 | 0.01 | 2,000 | A | F |

Table 1 was divided into Table 1-1 to Table 1-4, and the chemical liquid storage bodies of examples and comparative examples as well as the evaluation results of the chemical liquid storage bodies are described in the corresponding lines in Table 1-1 to Table 1-4.

For example, in the chemical liquid storage body of Example 1, a container was used which was obtained by performing a silica coating treatment on "Chemical 3600A" manufactured by Toyo Glass Co., Ltd. under the condition of a volume ratio of $Si(NCO)_4/O_2$ of 10/90, and then rinsing the resultant five times by means of ultrasonic washing at a frequency of 40 kHz and at an output of 250 W. Regarding the content of Na, $SiO_2$, and Ca in the container in which the chemical liquid was not yet stored, the content A was 0.15% by mass, the content B was 1.0% by mass, the content mass ratio A/B was 0.15, the content C was 96.0% by mass, the content D was 80.0% by mass, the content mass ratio C/D was 1.20, the content E was 0.016% by mass, the content F was 0.12% by mass, and E/F was 0.13. Regarding the composition of the chemical liquid just prepared, the total content of the specific metal ions was 0.001 mass ppt, the total content of the specific metal particles was 0.009 mass ppt, the total content of the specific metal was 0.01 mass ppt, and the total content of the organic impurities was 2,000 mass ppt. The chemical liquid contained an organic solvent PGMEA as balance. The short inhibition performance and the defect inhibition performance of the chemical liquid storage body were graded "A" by the evaluation. Other examples and comparative examples can be read in the same manner.

Example 1A: Preparation of Chemical Liquid Storage Body Storing Resist Composition (Actinic Ray-Sensitive or Radiation-Sensitive Composition)

In the resist composition described in Example 1 of WO2016/194839A, instead of "S1/S4 (PGMEA/cyclohexane)", the chemical liquid of Example 1 was used, thereby preparing a resist composition. The resist composition was stored in the container of Example 1, thereby obtaining a chemical liquid storage body of Example 1A.

(Short Inhibition Performance and Defect Inhibition Performance of Resist Composition)

The chemical liquid storage body prepared as above was preserved for 7 days at 25° C., and from the chemical liquid storage body after preservation, the resist composition was taken out. The resist composition was used in a photolithography process, and the short inhibition performance was evaluated in the same manner as that described above. As a result, the obtained result was the same as the result of Example 1.

Then, by using the chemical liquid storage body storing the resist composition, the defect inhibition performance was evaluated by the same method as that described above. As a result, the obtained result was the same as the result of Example 1.

Example 1B: Preparation of Chemical Liquid Storage Body Storing CMP Slurry

In the CMP slurry described in Table 2 #4 in paragraph "0058" in JP2009-510224A, instead of methanol, the chemical liquid of Example 1 was used, thereby preparing a CMP slurry. The CMP slurry was stored in the container of Example 1, thereby obtaining a chemical liquid storage body of Example 1B.

(Short Inhibition Performance and Defect Inhibition Performance of CMP Slurry)

The chemical liquid storage body prepared as above was preserved for 7 days at 25° C., and from the chemical liquid storage body after preservation, the CMP slurry was taken out. The CMP slurry was used in a wiring forming process using CMP, and a test substrate was prepared in the same manner as that used for testing the short inhibition performance described above. At this time, polishing was performed under the same condition as that described in JP2009-510224A. For the obtained test substrate, the short inhibition performance was evaluated by the same method as that described above. As a result, the obtained result was the same as the result of Example 1.

Furthermore, by the same method as that described above, the defect inhibition performance was evaluated. As a result, the obtained result was the same as the result of Example 1.

Example 1C: Preparation and Evaluation of Chemical Liquid Storage Body Storing p-CMP Rinsing Solution (Washing Solution Used after CMP)

In the p-CMP rinsing solution described in Example 6 in WO2005/043610A, instead of 1,4-butanediol, the chemical liquid of Example 1 was used, thereby preparing a p-CMP rinsing solution. The p-CMP rinsing solution was stored in the container of Example 1, thereby obtaining a chemical liquid storage body of Example 1C.

(Short Inhibition Performance and Defect Inhibition Performance of p-CMP Rinsing Solution)

The chemical liquid storage body prepared as above was preserved for 7 days at 25° C., and from the chemical liquid storage body after preservation, the p-CMP rinsing solution was taken out. The p-CMP rinsing solution was used in a wiring forming process using CMP, and a test substrate was prepared in the same manner as that used for testing the short inhibition performance described above. For the obtained test substrate, the short inhibition performance was evaluated by the same method as that described above. As a result, the obtained result was the same as the result of Example 1.

Furthermore, by the same method as that described above, the defect inhibition performance was evaluated. As a result, the obtained result was the same as the result of Example 1.

Examples 29 to 48

Table 2 shows the containers used for preparing the chemical liquid storage bodies of examples and comparative examples and the composition of each of the chemical liquids.

First, in the column of "Method for preparing container", commercial glass containers used for preparing the container, the conditions for the silica coating treatment, and the washing conditions (after the silica coating treatment) were described.

In the column of "Silica coating treatment", "10/90" or the like shows the composition (volume/volume) of a gas $(Si(NCO)_4/O_2)$ blown to the inner wall of a container at the time of silica coating treatment. The ultrasonic washing machine used for washing after the silica coating treatment in examples and comparative examples had an output of 250 W.

Furthermore, in order that the number of particles in the void portion and the chemical liquid as well as the concentration of the organic phosphorus compound fell into a predetermined range, the class of the clean room was adjusted.

Then, the results obtained by measuring the content of sodium atoms, $SiO_2$, calcium atoms and boron atoms in the container prepared as above by XPS were described in the column of "Content of Na, $SiO_2$, Ca, and B in container". The content was measured by the method described above.

The composition of each of the chemical liquids stored in each container was described in the column of "Composition of chemical liquid". Each of the chemical liquids contained the organic impurities, the specific metal component, and an organic solvent described in each line of Table 2 as balance. In the Table, the content of the organic impurities and the specific metal component represents the ratio thereof with respect to the total mass of the chemical liquid. Each of the components was measured by the method described above.

In Table 2, the column of "Number of particles in void portion" shows the number of particles (number/m$^3$) having a particle diameter equal to or greater than 0.05 μm in the void portion of the container.

The number of particles in the column of "Number of particles in void portion" was measured by a method using a particle counter manufactured by Particle Measuring Systems, Inc.

The column of "Number of particles in chemical liquid" shows the number of particles (number/ml) having a particle diameter equal to or greater than 0.05 μm in the chemical liquid.

The number of particles in the column of "Number of particles in chemical liquid" was measured by a method using KL-19F (particle counter manufactured by RION Co., Ltd.).

The column of "Concentration of organic phosphorus compound" shows the concentration (volume ppb) of an organic phosphorus compound in the void portion of the container.

The concentration of an organic phosphorus compound in the column of "Concentration of organic phosphorus compound" was measured by collecting the gas in the void by using a gas chromatograph: GC-14A manufactured by Shimadzu Corporation, a flame photometric detector, a gas chromatography mass spectrometer: QP-5050 manufactured by Shimadzu Corporation, and a Low Volume Air Sampler: SL-20 manufactured by SHIBATA SCIENTIFIC TECHNOLOGY LTD.

By using the obtained chemical liquid, (defect inhibition performance) and (short inhibition performance) were evaluated in the same manner as in Table 1.

(Preservation Stability)

After being prepared, each of the chemical liquid storage bodies was preserved for 6 months at 30° C., and then the (defect inhibition performance) was evaluated.

TABLE 2-1

| | Preparation of chemical liquid storage body Container Method for preparing container | |
|---|---|---|
| | Container formed of glass containing Na atoms | Condition of silica coating treatment $Si(NCO)_4/O_2$(volume ratio of gas) |
| Example 29 | Chemical 3600A manufactured by Toyo GlassCo., Ltd. | 10/90 |
| Example 30 | | |
| Example 31 | | |
| Example 32 | | |
| Example 33 | | |
| Example 34 | | |
| Example 35 | | |
| Example 36 | | |
| Example 37 | SCHOTT/DURAN 61-4411-54 screw-top bottle | 15/85 |
| Example 38 | | 15/85 |
| Example 39 | | 15/85 |
| Example 40 | | 15/85 |
| Example 41 | | 15/85 |
| Example 42 | | 10/90 |
| Example 43 | | 10/90 |
| Example 44 | | 25/75 |
| Example 45 | | 28/72 |
| Example 46 | | 5/95 |
| Example 47 | | 30/70 |
| Example 48 | | 35/65 |

TABLE 2-2

Preparation of chemical liquid storage body

| | Container | | | | | | | | | |
|---|---|---|---|---|---|---|---|---|---|---|
| | Method for preparing container | | | | Content of Na, SiO$_2$, and Ca in container | | | | | |
| | Washing conditions | | Number of | Number of | Concentration | Content of Na atoms (% by mass) | | | Content of SiO$_2$ (% by mass) | | |
| | Rinsing Number of times | Ultrasound Frequency | particles in void portion | particles in chemical liquid | of organic phosphorus compound | A Surface region | B Bulk region | A/B Content mass ratio | C Surface region | D Bulk region | C/D Content mass ratio |
| Example 29 | 5 | 40 kHz | 15 | 18 | 11 | 0.15 | 1.0 | 0.15 | 96.0 | 80.0 | 1.20 |
| Example 30 | | | 175 | 207 | 127 | 0.15 | 1.0 | 0.15 | 96.0 | 80.0 | 1.20 |
| Example 31 | | | 17 | 3 | 2 | 0.15 | 1.0 | 0.15 | 96.0 | 80.0 | 1.20 |
| Example 32 | | | 15 | 18 | 85 | 0.15 | 1.0 | 0.15 | 96.0 | 80.0 | 1.20 |
| Example 33 | | | 14 | 17 | 3 | 0.15 | 1.0 | 0.15 | 96.0 | 80.0 | 1.20 |
| Example 34 | | | 10 | 12 | 0.2 | 0.15 | 1.0 | 0.15 | 96.0 | 80.0 | 1.20 |
| Example 35 | | | 13 | 15 | 0.005 | 0.15 | 1.0 | 0.15 | 96.0 | 80.0 | 1.20 |
| Example 36 | | | 9 | 11 | 7 | 0.15 | 1.0 | 0.15 | 96.0 | 80.0 | 1.20 |
| Example 37 | | | 723 | 854 | 525 | 0.15 | 1.0 | 0.15 | 96.0 | 80.0 | 1.20 |
| Example 38 | | | 0 | 13 | 3 | 0.15 | 1.0 | 0.15 | 96.0 | 80.0 | 1.20 |
| Example 39 | | | 1200 | 356 | 21 | 0.15 | 1.0 | 0.15 | 96.0 | 80.0 | 1.20 |
| Example 40 | | | 16 | 3 | 13 | 0.15 | 1.0 | 0.15 | 96.0 | 80.0 | 1.20 |
| Example 41 | | | 18 | 515 | 15 | 0.15 | 1.0 | 0.15 | 96.0 | 80.0 | 1.20 |
| Example 42 | | | 13 | 15 | 9 | 0.15 | 1.0 | 0.15 | 96.0 | 80.0 | 1.20 |
| Example 43 | | | 12 | 14 | 9 | 0.15 | 1.0 | 0.15 | 96.0 | 80.0 | 1.20 |
| Example 44 | | | 10 | 12 | 7 | 0.15 | 1.0 | 0.15 | 96.0 | 80.0 | 1.20 |
| Example 45 | | | 14 | 16 | 10 | 0.15 | 1.0 | 0.15 | 96.0 | 80.0 | 1.20 |
| Example 46 | | | 13 | 15 | 9 | 0.15 | 1.0 | 0.15 | 96.0 | 80.0 | 1.20 |
| Example 47 | | | 14 | 17 | 11 | 0.15 | 1.0 | 0.15 | 96.0 | 80.0 | 1.20 |
| Example 48 | | | 12 | 14 | 9 | 0.15 | 1.0 | 0.15 | 96.0 | 80.0 | 1.20 |

TABLE 2-3

Preparation of chemical liquid storage body

| | Container Content of Na, SiO$_2$, and Ca in container Content of Ca atoms (% by mass) | | | Container Content of Na, SiO$_2$, Ca, and B in container Content B atoms (% by mass) | | | Chemical liquid Composition Organic solvent | |
|---|---|---|---|---|---|---|---|---|
| | E Surface region | F Bulk region | E/F Content mass ratio | G Surface region | H Bulk region | G/H Content mass ratio | Type | Content (based on mass) |
| Example 29 | 0.016 | 0.1 | 0.13 | | | | PGMEA | Balance |
| Example 30 | 0.016 | 0.1 | 0.13 | | | | PGMEA | Balance |
| Example 31 | 0.016 | 0.1 | 0.13 | | | | PGMEA | Balance |
| Example 32 | 0.016 | 0.1 | 0.13 | | | | PGMEA | Balance |
| Example 33 | 0.016 | 0.1 | 0.13 | | | | PGMEA | Balance |
| Example 34 | 0.016 | 0.1 | 0.13 | | | | PGMEA | Balance |
| Example 35 | 0.016 | 0.1 | 0.13 | | | | PGMEA | Balance |
| Example 36 | | | | 0.2 | 1.0 | 0.20 | PGMEA | Balance |
| Example 37 | | | | 0.1 | 1.0 | 0.10 | PGMEA | Balance |
| Example 38 | | | | 0.1 | 1.0 | 0.10 | PGMEA | Balance |
| Example 39 | | | | 0.1 | 1.0 | 0.10 | PGMEA | Balance |
| Example 40 | | | | 0.1 | 1.0 | 0.10 | PGMEA | Balance |
| Example 41 | | | | 0.1 | 1.0 | 0.10 | PGMEA | Balance |
| Example 42 | | | | 0.2 | 1.0 | 0.20 | PGMEA | Balance |
| Example 43 | | | | 0.2 | 1.0 | 0.20 | PGMEA | Balance |
| Example 44 | | | | 0.85 | 1.0 | 0.85 | PGMEA | Balance |
| Example 45 | | | | 0.95 | 1.0 | 0.95 | PGMEA | Balance |
| Example 46 | | | | 0.063 | 0.5 | 0.13 | PGMEA | Balance |
| Example 47 | | | | 1 | 14.0 | 0.07 | PGMEA | Balance |
| Example 48 | | | | 1 | 18.0 | 0.06 | PGMEA | Balance |

TABLE 2-4

| | Preparation of chemical liquid storage body | | | | | Evaluation | | |
|---|---|---|---|---|---|---|---|---|
| | Chemical liquid Composition | | | | | Short inhibition performance | Defect inhibition performance | Preservation stability 30° C., 6 months |
| | Content of specific metal (Fe, Al, Cr, or Ni) component | | | Content of organic impurities (mass ppt) | Void volume (%) | (after preservation) | (after preservation) | (after preservation) |
| | Ions (mass ppt) | Particles (mass ppt) | Total (mass ppt) | | | | | |
| Example 29 | 0.001 | 0.009 | 0.010 | 2,500 | 5 | A | A | A |
| Example 30 | 0.001 | 0.009 | 0.010 | 2,100 | 20 | A | C | C |
| Example 31 | 0.001 | 0.009 | 0.010 | 2,600 | 20 | B | A | A |
| Example 32 | 0.001 | 0.009 | 0.010 | 1,700 | 20 | A | A | A |
| Example 33 | 0.001 | 0.009 | 0.010 | 1,500 | 20 | A | A | A |
| Example 34 | 0.001 | 0.009 | 0.010 | 2,200 | 20 | A | A | A |
| Example 35 | 0.001 | 0.009 | 0.010 | 2,600 | 20 | A | C | C |
| Example 36 | 0.001 | 0.009 | 0.010 | 1,500 | 5 | A | A | A |
| Example 37 | 0.001 | 0.009 | 0.010 | 2,100 | 40 | B | C | D |
| Example 38 | 0.001 | 0.009 | 0.010 | 2,100 | 40 | B | A | C |
| Example 39 | 0.001 | 0.009 | 0.010 | 2,100 | 40 | B | A | D |
| Example 40 | 0.001 | 0.009 | 0.010 | 2,100 | 40 | B | A | C |
| Example 41 | 0.001 | 0.009 | 0.010 | 2,100 | 40 | B | A | C |
| Example 42 | 0.001 | 0.009 | 0.010 | 2,500 | 20 | A | A | A |
| Example 43 | 0.001 | 0.009 | 0.010 | 2,600 | 20 | A | A | A |
| Example 44 | 0.001 | 0.009 | 0.010 | 1,800 | 20 | A | A | A |
| Example 45 | 0.001 | 0.009 | 0.010 | 1,700 | 20 | A | A | C |
| Example 46 | 0.001 | 0.009 | 0.010 | 1,500 | 20 | A | A | A |
| Example 47 | 0.001 | 0.009 | 0.010 | 2,200 | 20 | A | A | C |
| Example 48 | 0.001 | 0.009 | 0.010 | 2,600 | 20 | A | A | C |

Table 2 is divided into Table 2-1 to Table 2-4. The chemical liquid storage bodies of examples and comparative examples as well as the evaluation results thereof are described in the corresponding lines in Table 2-1 to Table 2-4.

As shown in Table 2, it was confirmed that in a case where the number of particles having a particle diameter equal to or greater than 0.05 μm in the void portion of the container is 1 to 1,000/m$^3$, the number of particles having a particle diameter equal to or greater than 0.05 μm in the chemical liquid is 5 to 500/ml, and the concentration of an organic phosphorus compound in the void portion of the container is 0.01 to 100 volume ppb, the effects are further improved.

What is claimed is:

1. A chemical liquid storage body comprising:
   a container; and
   a chemical liquid stored in the container,
   wherein the chemical liquid contains at least one kind of metal component selected from the group consisting of Fe, Al, Cr, and Ni,
   in a case where the chemical liquid contains one kind of metal component selected from the group consisting of Fe, Al, Cr, and Ni, a content of the metal component with respect to a total mass of the chemical liquid is equal to or smaller than 100 mass ppt,
   in a case where the chemical liquid contains two or more kinds of metal components selected from the group consisting of Fe, Al, Cr, and Ni, a total content of the metal components with respect to the total mass of the chemical liquid is equal to or smaller than 100 mass ppt,
   at least a portion of a liquid contact portion of the container is formed of glass containing sodium atoms, and
   provided that a region between a surface of the liquid contact portion and a position 10 nm below the surface in a thickness direction of the container is a surface region, a region between the surface and a position 2.0 μm below the surface in the thickness direction of the container is bulk region, B represents a content of sodium atoms in the bulk region with respect to a total mass of the bulk region, and A represents a content of sodium atoms in the surface region with respect to a total mass of the surface region, in a case where the surface region and the bulk region are measured by X-ray photoelectron spectroscopy, a content mass ratio of A to B represented by A/B is higher than 0.10 and less than 1.0 in at least a portion of the liquid contact portion, and
   a void volume calculated by the following equation is 5% to 40% by volume, and in a void portion of the container, the number of particles having a particle diameter equal to or greater than 0.05 μm is 1 to 1,000/m$^3$, wherein Equation: void volume={1−(volume of chemical liquid in container/volume of container)}×100.

2. The chemical liquid storage body according to claim 1, wherein the metal component contains metal particles.

3. The chemical liquid storage body according to claim 2, wherein the content mass ratio A/B is higher than 0.10 and less than 0.80.

4. The chemical liquid storage body according to claim 2, wherein the content B is 1.0% to 20% by mass.

5. The chemical liquid storage body according to claim 1, wherein the content mass ratio A/B is higher than 0.10 and less than 0.80.

6. The chemical liquid storage body according to claim 5, wherein the content B is 1.0% to 20% by mass.

7. The chemical liquid storage body according to claim 1, wherein the content B is 1.0% to 20% by mass.

8. The chemical liquid storage body according to claim 1, wherein the content B is 1.0% to 10% by mass.

9. The chemical liquid storage body according to claim 1, wherein provided that D represents a content of SiO$_2$ in the bulk region with respect to the total mass of the bulk region, and C represents a content of $SiO_2$ in the surface region with respect to the total mass of the surface region, in a case where the surface region and the bulk region are measured by X-ray photoelectron spectroscopy, a content mass ratio of C to D represented by C/D is higher than 1.00 and less than 1.45 in at least a portion of the surface.

10. The chemical liquid storage body according to claim 9,
wherein the content mass ratio C/D is higher than 1.00 and less than 1.30.

11. The chemical liquid storage body according to claim 9,
wherein the content D is 68.0% to 80.0% by mass.

12. The chemical liquid storage body according to claim 1,
wherein the glass further contains at least one of calcium atoms or potassium atoms.

13. The chemical liquid storage body according to claim 1,
wherein the glass further contains calcium atoms, and
provided that F represents a content of calcium atoms in the bulk region with respect to the total mass of the bulk region, and E represents a content of calcium atoms in the surface region with respect to the total mass of the surface region, in a case where the surface region and the bulk region are measured by X-ray photoelectron spectroscopy, a content mass ratio of E to F represented by E/F is higher than 0.10 and less than 0.90 in at least a portion of the surface.

14. The chemical liquid storage body according to claim 13,
wherein the content mass ratio E/F is higher than 0.10 and less than 0.70.

15. The chemical liquid storage body according to claim 13,
wherein the content F is 0.10% to 15% by mass.

16. The chemical liquid storage body according to claim 13,
wherein the content F is 0.10% to 10% by mass.

17. The chemical liquid storage body according to claim 1,
wherein the glass further contains boron atoms, and
provided that H represents a content of boron atoms in the bulk region with respect to the total mass of the bulk region, and G represents a content of boron atoms in the surface region with respect to the total mass of the surface region, in a case where the surface region and the bulk region are measured by X-ray photoelectron spectroscopy, a content mass ratio of G to H represented by G/H is higher than 0.10 and less than 0.90 in at least a portion of the surface.

18. The chemical liquid storage body according to claim 1,
wherein in the chemical liquid, the number of particles having a particle diameter equal to or greater than 0.05 μm is 5 to 500/ml.

19. The chemical liquid storage body according to claim 1,
wherein in a void portion of the container, a concentration of an organic phosphorus compound is 0.01 to 100 volume ppb.

* * * * *